US012691669B2

(12) United States Patent 
Nogami et al.

(10) Patent No.: US 12,691,669 B2 
(45) Date of Patent: Jul. 28, 2026

(54) PROTECTION FILM, METHOD FOR AFFIXING SAME, AND METHOD FOR MANUFACTURING SEMICONDUCTOR COMPONENT

(71) Applicant: MITSUI CHEMICALS ICT MATERIA, INC., Chuo-ku (JP)

(72) Inventors: Masao Nogami, Nagoya (JP); Akimitsu Morimoto, Kawasaki (JP)

(73) Assignee: MITSUI CHEMICALS ICT MATERIA, INC., Tokyo (JP)

( * ) Notice: Subject to any disclaimer, the term of this patent is extended or adjusted under 35 U.S.C. 154(b) by 211 days.

(21) Appl. No.: 18/753,478

(22) Filed: Jun. 25, 2024

(65) Prior Publication Data

US 2024/0343029 A1     Oct. 17, 2024

Related U.S. Application Data

(62) Division of application No. 17/439,238, filed as application No. PCT/JP2020/013846 on Mar. 26, 2020, now Pat. No. 12,064,946.

(30) Foreign Application Priority Data

Mar. 27, 2019     (JP) ................................. 2019-061828

(51) Int. Cl. 
*B32B 37/10*          (2006.01) 
*B32B 37/12*          (2006.01) 
          (Continued)

(52) U.S. Cl. 
CPC .............. *B32B 37/10* (2013.01); *B32B 37/12* (2013.01); *H10P 72/0428* (2026.01); 
          (Continued)

(58) Field of Classification Search 
CPC ............................ B32B 37/10; H10P 72/7402 
See application file for complete search history.

(56) References Cited

U.S. PATENT DOCUMENTS 7,438,631 B2     10/2008 Nagamoto et al. 
9,559,073 B2      1/2017 Tamura et al. 
          (Continued)

FOREIGN PATENT DOCUMENTS

DE          102015216619      *  3/2017  ........... H01L 21/683 
JP           2000017239 A         1/2000 
          (Continued)

OTHER PUBLICATIONS

Office Action issued Jun. 4, 2025, by the Korean Patent Office in corresponding KR Application No. 10-2024-7022400, and English translation of the Office Action (11 pages).

(Continued)

*Primary Examiner* — Philip C Tucker 
*Assistant Examiner* — John Blades 
(74) *Attorney, Agent, or Firm* — Panitch Schwarze Belisario & Nadel LLP

(57) ABSTRACT

Provided are a method for affixing a protective film, a method for manufacturing a semiconductor component, and a protective film for use in the affixing method, which are capable of suppressing occurrence of a failure caused by a step on a main surface of a semiconductor wafer. The affixing method includes: an arrangement step of arranging a protective film so as to cover a main surface A of a semiconductor wafer; and an affixing step of pressing the protective film against the main surface to affix the protective film to the main surface. The affixing step includes a compression step of compressing the protective film in a thickness direction thereof.

5 Claims, 12 Drawing Sheets

(51) Int. Cl.
    *H10P 72/00*     (2026.01)
    *H10P 72/70*     (2026.01)
    *B32B 37/00*     (2006.01)

(52) U.S. Cl.
    CPC ...... *H10P 72/7402* (2026.01); *B32B 37/0046*
        (2013.01); *H10P 72/7416* (2026.01); *H10P*
        *72/7422* (2026.01)

(56) References Cited

U.S. PATENT DOCUMENTS

| | | | |
|---|---|---|---|
| 10,727,128 | B2 | 7/2020 | Priewasser et al. |
| 2007/0066184 | A1 | 3/2007 | Nagamoto et al. |
| 2010/0038009 | A1 | 2/2010 | Okuno et al. |
| 2013/0306215 | A1 | 11/2013 | Toida |
| 2014/0079947 | A1 | 3/2014 | Tamura et al. |
| 2018/0315610 | A1 | 11/2018 | Sekiya et al. |
| 2018/0330938 | A1 | 11/2018 | Sekiya |
| 2019/0252254 | A1 | 8/2019 | Priewasser et al. |
| 2022/0153009 | A1 | 5/2022 | Nogami et al. |
| 2022/0157626 | A1 | 5/2022 | Nogami et al. |

FOREIGN PATENT DOCUMENTS

| | | | |
|---|---|---|---|
| JP | 2005123382 | A | 5/2005 |
| JP | 2008066684 | A | 3/2008 |
| JP | 2008166459 | A | 7/2008 |
| JP | 2009246196 | A | 10/2009 |
| JP | 2010118584 | A | 5/2010 |
| JP | 2012059929 | A | 3/2012 |
| JP | 2012099622 | A | 5/2012 |
| JP | 2012199406 | A | 10/2012 |
| JP | 2013048296 | A | 3/2013 |
| JP | 2013239564 | A | 11/2013 |
| JP | 2013243309 | A | 12/2013 |
| JP | 2015082619 | A | 4/2015 |
| KR | 20100020432 | A | 2/2010 |
| SG | 189515 | A1 | 5/2013 |
| SG | 10201900566 | P | 9/2019 |
| WO | 2013021644 | A1 | 2/2013 |

OTHER PUBLICATIONS

Office Action (Notice of Reasons for Refusal) issued on May 7, 2024, by the Japanese Patent Office in corresponding Japanese Patent Application No. 2021-509617, and an English translation of the Office Action. (10 pages).

Office Action issued on Oct. 6, 2022, by the U.S. Patent and Trademark Office in the U.S. Appl. No. 17/439,238, filed Oct. 6, 2022, U.S. Patent and Trademark Office, Alexandria, VA. (8 pages).

Extended European Search Report dated Jan. 26, 2023, issued by the European Patent Office in corresponding European Application No. 20777870.5. (12 pages).

Office Action (Request for the Submission of an Opinion) issued on Dec. 12, 2022, by the Korean Intellectual Property Office in corresponding Korean Patent Application No. 10-2021-7031634, and an English translation of the Office Action. (17 pages).

Written Opinion/Search Report issued on Feb. 24, 2023, by the Intellectual Property Office of Singapore in corresponding Singapore Patent Application No. 11202109556Q. (12 pages).

Extended European Search Report issued on Mar. 14, 2023, by the European Patent Office in corresponding European Application No. 20778241.8. (12 pages).

Office Action issued on Jan. 31, 2023, by the Taiwanese Patent Office in corresponding Taiwan Patent Application No. 109110327, and an English Translation of the Office Action. (10 pages).

Office Action issued on Jun. 26, 2023, by the Korean Intellectual Property Office in Korean Patent Application No. 10-2021-7031634, with an English translation of the Office Action. (8 pages).

Written Opinion issued on Jun. 14, 2023, by the Intellectual Property Office of Singapore in corresponding Singaporean Patent Application No. 11202109557S. (8 pages).

Office Action issued on Jul. 19, 2023, by the Korean Intellectual Property Office in corresponding Korean Patent Application No. 10-2021-7031631, and an English translation of the Office Action. (14 pages).

Office Action (Communication pursuant to Article 94(3) EPC) issued Oct. 11, 2023, by the European Patent Office in corresponding European Patent Application No. 20 777 870.5. (6 pages).

Written Opinion issued Oct. 11, 2023, by the Intellectual Property Office of Singapore in Singapore Patent Application No. 11202109556Q. (8 pages).

Office Action issued on Sep. 18, 2023, by the U.S. Patent and Trademark Office in U.S. Appl. No. 17/439,238, U.S. Patent and Trademark Office, Alexandria, VA. (5 pages).

Office Action issued on Sep. 20, 2023, by the Taiwan Patent Office in Taiwanese Patent Application No. 109110320 and an English translation of the Office Action. (12 pages).

Office Action (Communication pursuant to Article 94(3) EPC) issued on Oct. 26, 2023, by the European Patent Office in European Patent Application No. 20 778 241.8. (5 pages).

Written Opinion issued Nov. 17, 2023, by the Intellectual Property Office of Singapore in Singapore Patent Application No. 11202109557S. (7 pages).

Office Action (The First Office Action) issued on Nov. 1, 2023, by the State Intellectual Property Office of People's Republic of China in corresponding Chinese Patent Application No. 202080024235.8 and an English translation of the Office Action. (18 pages).

Office Action (First Notice of Examination Action) issued on Dec. 27, 2023, by the State Intellectual Property Office in Chinese Patent Application No. 202080024347.3, and an English translation of the Office Action. (28 pages).

Office Action (Notice of Final Rejection) issued on Feb. 2, 2024, by the Korean Intellectual Property Office in corresponding Korean Patent Application No. 10-2021-7031631, and an English translation of the Office Action. (9 pages).

Office Action issued on Nov. 15, 2023, by the U.S. Patent and Trademark Office in U.S. Appl. No. 17/439,188, U.S. Patent and Trademark Office, Alexandria, VA. (9 pages).

Office Action (Advisory Action) issued on Feb. 13, 2024, by the U.S. Patent and Trademark Office in U.S. Appl. No. 17/439,188, U.S. Patent and Trademark Office, Alexandria, VA. (3 pages).

Office Action issued on Mar. 6, 2024, by the U.S. Patent and Trademark Office in U.S. Appl. No. 17/439,188, U.S. Patent and Trademark Office, Alexandria, VA. (7 pages).

Office Action issued on Jun. 9, 2023, by the U.S. Patent and Trademark Office in U.S. Appl. No. 17/439,188. (24 pages).

* cited by examiner

PROTECTION FILM, METHOD FOR AFFIXING SAME, AND METHOD FOR MANUFACTURING SEMICONDUCTOR COMPONENT

CROSS REFERENCE OF RELATED APPLICATIONS

This application is a division of U.S. patent application Ser. No. 17/439,238, filed on Sep. 14, 2021, entitled "PROTECTION FILM, METHOD FOR AFFIXING SAME, AND METHOD FOR MANUFACTURING SEMICONDUCTOR COMPONENT," which in turn is a national stage application of PCT/JP2020/013846, filed on Mar. 26, 2020, which in turn claims priority to Japanese Patent Application No. 2019-061828, filed on Mar. 27, 2019. The entire content of each of the prior applications is hereby incorporated by reference.

TECHNICAL FIELD

The present invention relates to a protective film to be affixed to a main surface of a semiconductor wafer when a semiconductor component is manufactured from the semiconductor wafer, a method for affixing the protective film, and a method for manufacturing a semiconductor component including the method for affixing the protective film.

BACKGROUND ART

In a case where a front surface of a semiconductor wafer on which a circuit or the like is formed is defined as a main surface and a surface opposite to the main surface is defined as a back surface, the back surface is ground, in a back grinding step, so that the semiconductor wafer is to have a desired thickness at the time of manufacturing a semiconductor component. This back grinding step is performed, for example, by affixing a protective film to the main surface of the semiconductor wafer, and sucking and fixing the main surface to a chuck table via the protective film.

The protective film usually has a base layer and an adhesive layer. As a general method for affixing the protective film, a method is employed in which the protective film is arranged on the main surface of the semiconductor wafer such that the adhesive layer is in contact with the main surface, and then a predetermined force is applied to the base layer using an affixing roller or the like to press the adhesive layer against the main surface.

In recent years, in many semiconductor wafers, bumps or microelectromechanical systems (MEMSs) are provided on the main surface due to the demand for higher density of semiconductor components, and the main surface is uneven. When the above-described general method for affixing a protective film to such an uneven main surface is employed, the surface of the protective film pressed against the main surface becomes uneven following the unevenness of the main surface, so that various failures occur. Therefore, an unevenness absorbent resin layer, a step absorption layer, or the like is provided as a protective film to improve the unevenness followability, thereby making it difficult for the unevenness to occur on the surface (see Patent Literature 1).

CITATIONS LIST

Patent Literature

Patent Literature 1: JP 2000-17239 A

SUMMARY OF INVENTION

Technical Problems

In the above-described semiconductor wafer, the bumps and the like are not necessarily provided in the entire region of the main surface. Specifically, some semiconductor wafers have, on their main surface, both an uneven region where bumps or the like are provided and a flat region where no bump or the like is provided.

For example, as the semiconductor wafer, there is a semiconductor wafer in which a region where no bumps are arranged is intentionally provided at a peripheral edge part of a main surface for the purpose of imprinting a serial number or a production number (see "reference sign 13B" in FIG. 1(*a*)).

On the main surface of the semiconductor wafer described above, a step is generated between the uneven region and the flat region such that the uneven region is high and the flat region is low.

FIG. 8 is an explanatory view in a case where a protective film 20 is affixed to a semiconductor wafer 10 having the step on a main surface 10A by a general affixing method.

The protective film 20 has a resin volume amount (hereinafter, also referred to as "amount of thickness") at least sufficient for the unevenness absorption layer 23 to absorb the unevenness due to bumps 11 in a first region 12, but, in some cases, the amount of thickness is insufficient to fill the step between the first region 12 and a second region 13, so that the step cannot be filled.

In particular, the second region 13 provided on the main surface 10A for the purpose of imprinting the serial number or the production number described above has a large size (area thereof occupying the main surface 10A), and the amount of thickness of the protective film 20 is significantly insufficient to fill the step over the entire second region 13 of this size.

In addition, as indicated by an arrow in FIG. 8, the thick portion (unevenness absorption layer 23) of the protective film 20 flows so as to escape further outward from a peripheral edge of the main surface 10A of the semiconductor wafer 10. However, the general affixing method does not include a means for restricting the flow of the thick portion.

Therefore, since the amount of thickness of the protective film 20 is insufficient to fill the step in the second region 13, a defect 24 such as a dent, a recess, or the like following the step is formed on the surface of the protective film 20.

When the main surface is sucked and fixed in the back grinding step described above, the protective film 20 floats from the chuck table at the portion of the defect 24, and the vacuum is easily broken. Therefore, a vacuum error, that is, a suction failure of the semiconductor wafer to the chuck table, may occur in the back grinding step.

In addition, even when no vacuum error is caused, the protective film 20 floats from the chuck table at the portion of the defect 24, and cannot sufficiently support an external force applied from the back surface side at the time of performing the back grinding step. For this reason, there is a possibility that a crack, cracking, or an invisible microcrack may be caused in the semiconductor wafer after the back grinding step is performed.

As described above, the step caused on the main surface of the semiconductor wafer cannot be filled by using a general method for affixing a protective film even when using a protective film provided with an unevenness absorbent resin layer or the like. For this reason, there is a problem that a dent, a recess, or the like following the step is formed on the surface of the protective film, so that a failure such as a vacuum error or a crack occurs in the back grinding step.

The present invention has been made in view of the above problems, and provides a protective film, a method for affixing the protective film, and a method for manufacturing a semiconductor component, which are capable of suppressing occurrence of a failure caused by a step on a main surface of a semiconductor wafer.

Solutions to Problems

As a means for solving the above problems, the present invention is as follows.

[1] A method for affixing a protective film according to a first invention is a method for affixing a protective film, including: an arrangement step of arranging a protective film so as to cover a main surface of a semiconductor wafer; and an affixing step of pressing the protective film against the main surface to affix the protective film to the main surface, characterized in, that the main surface has a first region in which bumps are arranged and a second region which includes at least a part of a peripheral edge of the main surface and in which no bumps are arranged, that the affixing step includes a compression step of compressing the protective film in a thickness direction thereof, and that the compression step is performed using a pressing member for pressing the protective film against the main surface and a support member installed along an outer peripheral edge of the second region.

[2] In the method for affixing a protective film according to the first invention, the arrangement step can be a step of arranging the protective film such that an edge part of the protective film protrudes outward from the peripheral edge of the second region, and the compression step can be a step of compressing the edge part of the protective film by using the support member to support the edge part and sandwiching the edge part between the support member and the pressing member.

[3] In the method for affixing a protective film according to the first invention, in the support member, a support surface that supports the edge part of the protective film can be parallel to the main surface or inclined so as to face the main surface side.

[4] In the method for affixing a protective film according to the first invention, having a relationship of $C_1 > C_2$, where a clearance between the main surface of the semiconductor wafer and a pressing surface of the pressing member is $C_1$, and a clearance between the support surface of the support member and the pressing surface of the pressing member is $C_2$.

[5] In the method for affixing a protective film according to the first invention, the arrangement step can be a step of arranging the protective film such that an edge part of the protective film is positioned on an inner peripheral side of the support member, and the compression step can be a step of compressing the edge part with the pressing member, an inner peripheral surface of the support member, and the main surface so that the inner peripheral surface of the support member blocks bulging of the protective film in an outer peripheral direction of the second region when the protective film is sandwiching between the pressing member and the main surface.

[6] In the method for affixing a protective film according to the first invention, the protective film has a layer capable of exhibiting fluidity or plasticity.

[7] In the method for affixing a protective film according to the first invention, the compression step can be performed in a state where the protective film is heated and the fluidity or the plasticity is exhibited.

[8] In the method for affixing a protective film according to the first invention, having a relationship of $0.5 \leq H2/H1$, where an average height of the bumps is H1 and an average thickness of the protective film is H2.

[9] A method for manufacturing a semiconductor component according to a second invention includes the method for affixing a protective film according to the first invention.

[10] A protective film according to a third invention is used in the method for affixing a protective film according to the first invention.

[11] A method for affixing a protective film according to a fourth invention is a method for affixing a protective film, including:

a processing step of processing a protective film to prepare a processed film;

an arrangement step of arranging the processed film so as to cover a main surface of a semiconductor wafer; and an affixing step of pressing the processed film against the main surface to affix the processed film to the main surface, characterized in, that the main surface has a first region in which bumps are arranged and a second region which includes at least a part of a peripheral edge of the main surface and in which no bumps are arranged, that the processing step is a step of forming sites different in thicknesses in the protective film to prepare the processed film, and that the arrangement step is a step of arranging a region having a relatively large thickness among the sites different in thicknesses of the processed film such that the region corresponds to the second region.

[12] In the method for affixing a protective film according to the fourth invention, the protective film has a layer capable of exhibiting fluidity or plasticity.

[13] In the method for affixing a protective film according to the fourth invention, the processing step can be performed in a state where the protective film is heated and the fluidity or the plasticity is exhibited.

[14] In the method for affixing a protective film according to the fourth invention, having a relationship of $0.5 \leq H2/H1$, where an average height of the bumps is H1 and an average thickness of the protective film is H2.

[15] A method for manufacturing a semiconductor component according to a fifth invention includes the method for affixing a protective film according to the fourth invention.

[16] A protective film according to a sixth invention is used in the method for affixing a protective film according to the fourth invention.

Advantageous Effects of Invention

According to the methods for affixing a protective film of the first and fourth inventions, when a step exists due to the presence or absence of the bump on the main surface of the semiconductor wafer, the protective film can be affixed so as to suppress or eliminate the step. As a result, the surface of the protective film can be made substantially flat, and the occurrence of a failure caused by the step on the main surface of the semiconductor wafer can be suppressed.

According to the methods for manufacturing a semiconductor component of the second and fifth inventions, it is possible to suppress the occurrence of a failure caused by the step on the main surface of the semiconductor wafer. As a result, the semiconductor component can be efficiently manufactured.

According to the protective films of the third and sixth inventions, it is possible to suppress the occurrence of a failure caused by the step on the main surface of the semiconductor wafer. As a result, the semiconductor component can be efficiently manufactured.

DESCRIPTION OF EMBODIMENTS

Hereinafter, the present invention will be described with reference to the drawings. The particulars described herein are given by way of example and for the purpose of illustrative discussion of the embodiments of the present invention, and are presented for the purpose of providing what is believed to be the description from which the principles and conceptual features of the present invention can be most effectively and readily understood. In this point, the embodiments are necessary for fundamental comprehension of the present invention and how some embodiments of the present invention are embodied in practice is clearly shown to those skilled in the art by an explanation in connection with drawings without intending to indicate a structural detail of the present invention above a certain level.

[1] Affixing Method (First Embodiment)

The present affixing method is a first embodiment according to the first invention, and is a method for affixing a protective film 20 that protects a main surface 10A of a semiconductor wafer 10.

Figures 4A, 4B:
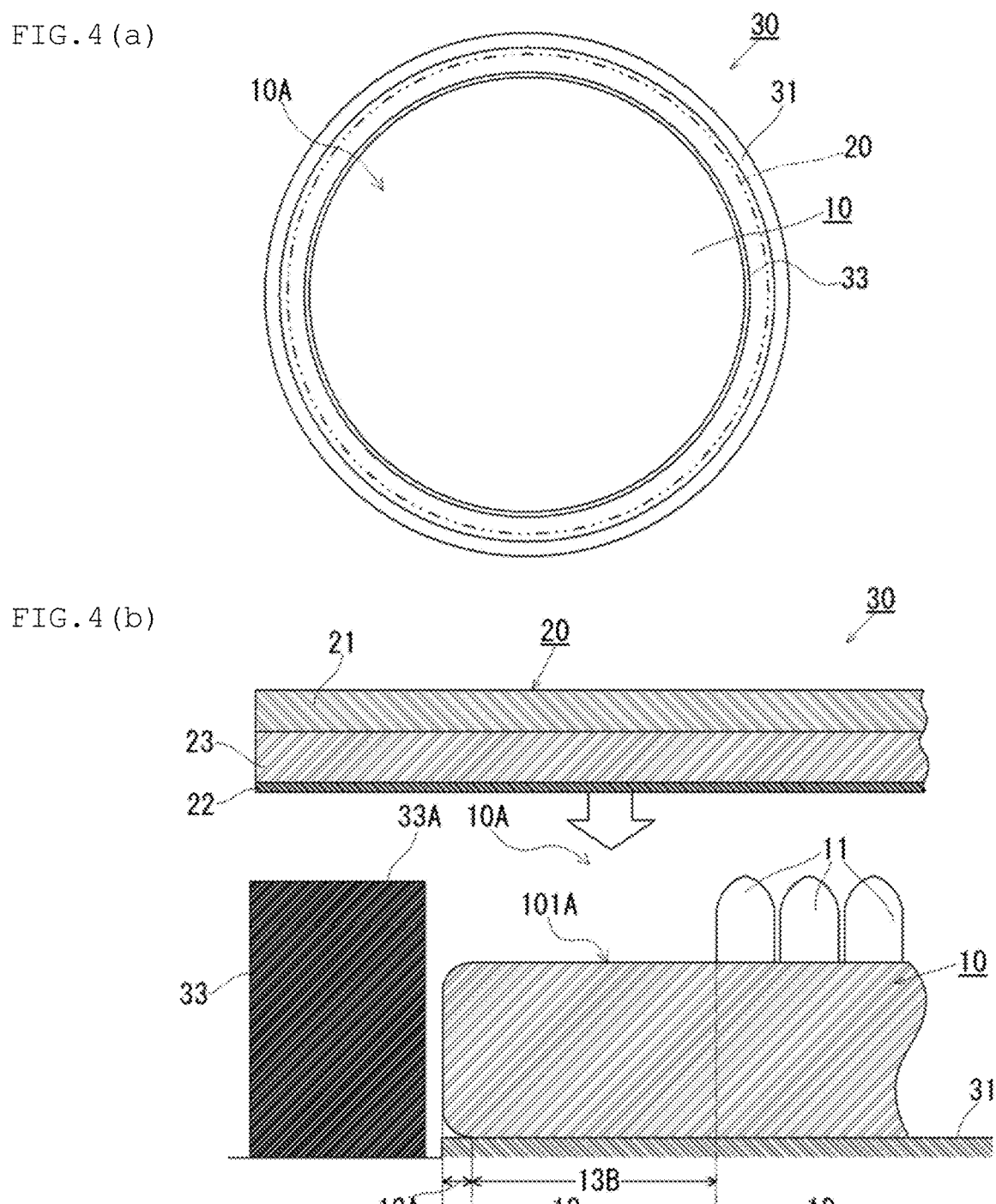
FIG. 4(a) is a plan view and FIG. 4(b) is an enlarged side cross-sectional view, for explaining an arrangement step according to the affixing method of the first invention.

This affixing method includes an arrangement step S1 (see FIG. 4(b)) of arranging the protective film 20 so as to cover the main surface 10A of the semiconductor wafer 10, and an affixing step S2 (see FIG. 5) of pressing the protective film 20 against the main surface 10A to affix the protective film 20 to the main surface 10A.

Figures 1A, 1B, 2:
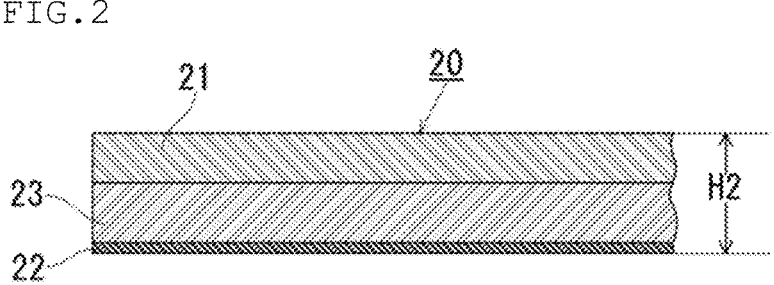
FIG. 1(a) is a plan view and FIG. 1(b) is an enlarged side cross-sectional view taken along a line 1B-1B in FIG. 1(a), for explaining a semiconductor wafer to be subjected to an affixing method of the present invention.
FIG. 2 is an enlarged side cross-sectional view for explaining a protective film according to the present invention.

The main surface 10A of the semiconductor wafer 10 has a first region 12 in which bumps 11 are arranged, and a second region 13 which includes at least a part of a peripheral edge of the main surface 10A and in which the bumps 11 are not arranged (see FIGS. 1(a) and (b)).

Figure 6:
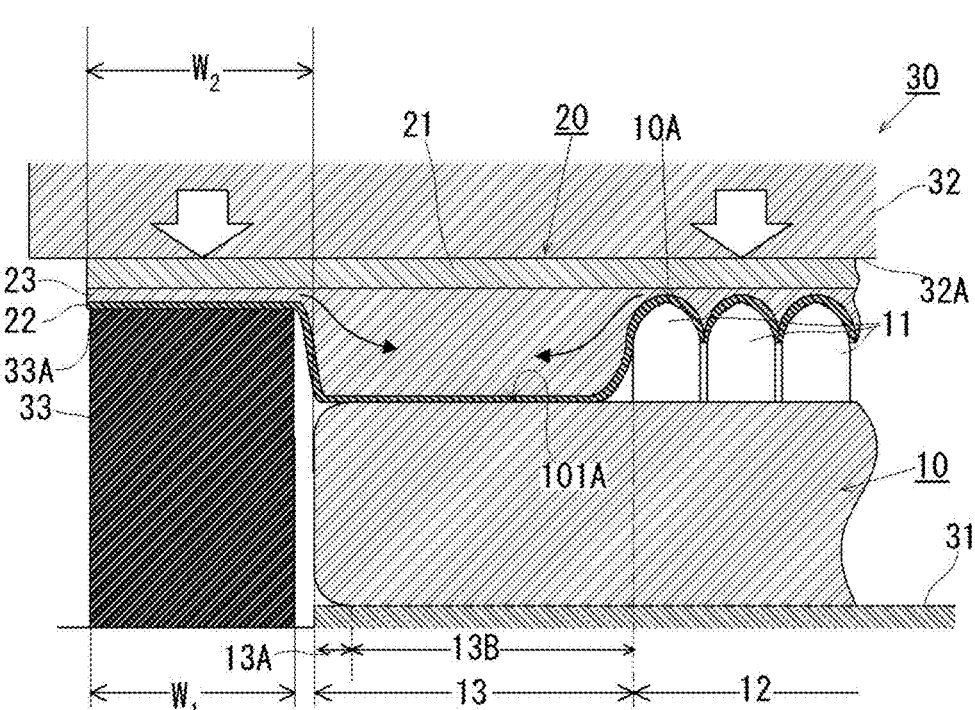
FIG. 6 is an enlarged side cross-sectional view for explaining a compression step according to the affixing method of the first invention.

Then, the affixing step S2 includes a compression step S3 of compressing the protective film 20 in its thickness direction (see FIG. 6). The compression step S3 is performed using a pressing member 32 for pressing the protective film 20 against the main surface 10A and a support member 33 installed along an outer peripheral edge of the second region 13.

The semiconductor wafer 10 to which the protective film 20 is affixed by the present affixing method has a desired thickness in a back grinding step, is divided into individual pieces, and is subjected to various types of processing to manufacture a semiconductor component from the semiconductor wafer 10.

That is, the present affixing method (first embodiment) is included in a method for manufacturing a semiconductor component according to the second invention.

The semiconductor wafer 10 to be subjected to the present affixing method has the bumps 11 on either one of the front and back surfaces, and the entire surface of the semiconductor wafer 10 on a side having the bumps 11 is the main surface 10A (see FIG. 1(*b*)).

The present affixing method can be performed using an affixing apparatus affixing apparatus 30 (see FIG. 3) capable of executing the arrangement step S1, the affixing step S2, and the compression step S3.

The pressing member 32 and the support member 33 can be provided in the affixing apparatus affixing apparatus 30.

In the present affixing method, the affixing step S2 includes the compression step S3 of compressing the protective film 20 in its thickness direction. The compression step S3 is performed using the pressing member 32 for pressing the protective film 20 against the main surface 10A and the support member 33 installed along the outer peripheral edge of the second region 13 of the main surface 10A.

In the compression step S3, in the protective film 20 compressed in the thickness direction, a layer (unevenness absorption layer 23) exhibiting fluidity or plasticity appropriately flows according to a step or unevenness, and causes offset of a thick portion that fills the step or the unevenness.

In addition, when the compression step S3 is performed using the pressing member 32 and the support member 33, the flow of the thick portion of the protective film 20 further outward from the peripheral edge of the main surface 10A is restricted.

Then, the flow of the thick portion of the protective film 20 is restricted, as described above, so that the thick portion (unevenness absorption layer 23) of the protective film 20 is thickly offset on the second region 13 of the main surface 10A, whereby the step on the main surface 10A is filled, and the surface of the protective film 20 becomes flat.

[2] Semiconductor Wafer

A material and a shape of the semiconductor wafer 10 according to the present affixing method are not particularly limited, but, usually, the semiconductor wafer 10 is formed in a disk shape using silicon as a material.

As illustrated in FIGS. 1(*a*) and (*b*), the semiconductor wafer 10 has a plurality of the bumps 11 on the main surface 10A.

Here, the main surface 10A is an entire surface, of the semiconductor wafer 10 having the bumps 11, on a side where the bumps 11 are provided. The main surface 10A includes a surface of the semiconductor wafer 10 and surfaces of the bumps 11. In addition, in this semiconductor wafer 10, a surface opposite to the main surface 10A is defined as a back surface.

The main surface 10A has the first region 12 in which bumps 11 are arranged and the second region 13 in which no bumps 11 are arranged.

Of these regions, the second region 13 includes a peripheral edge region 13A and a blank region 13B.

Of these regions, the peripheral edge region 13A is a region forming a peripheral edge of the semiconductor wafer 10 (that is, a region forming a peripheral edge of main surface 10A). In general, a chamfered portion 14 is provided on the peripheral edge of the semiconductor wafer 10 for the purpose of preventing chipping or cracking of the peripheral edge (see FIGS. 1(*b*) and 11(*b*)), and a region including the chamfered portion 14 is the peripheral edge region 13A. Therefore, no bumps are arranged in the peripheral edge region 13A including the chamfered portion 14.

On the other hand, the blank region 13B is a region where bumps can be arranged, but no bumps are actually arranged.

Specifically, the blank region 13B is a region obtained by removing the peripheral edge region 13A from the second region 13.

Although a shape (planar shape) of each region described above is not limited, for example, the first region 12 can be provided in a substantially circular shape in plan view at a substantially central portion of the main surface 10A, as illustrated in FIG. 1(*a*). Also, the first region 12 can be provided in a polygonal shape in plan view at the substantially central portion of the main surface 10A, as illustrated in FIG. 11(*a*).

In order to make the first region 12 and the second region 13 easy to understand, boundary lines between these regions are indicated by two-dot chain lines in FIGS. 1(*a*) and 11(*a*).

For example, as illustrated in FIGS. 1(*a*) and 11(*a*), the second region 13 can be provided in a shape enclosing the first region 12.

Furthermore, the shape of the peripheral edge region 13A constituting the second region 13 can be, for example, a substantially annular shape in plan view so as to enclose the first region 12 inside (see FIGS. 1 and 11).

The shape (planar shape) of the blank region 13B can be an arch shape as illustrated in FIG. 1(*a*). That is, the blank region 13B can be provided by expanding the peripheral edge region 13A in an arch shape toward the center of the main surface 10A on the left side portion of the main surface 10A. Such a blank region 13B can be used for the purpose of displaying (for example, an engraved mark or the like) various types of information such as a serial number and a production number of the semiconductor wafer 10. Therefore, the arcuate blank region 13B in FIG. 1(*a*) can also be referred to as an identification region.

In addition, as exemplified in FIG. 11(*a*), the shape (planar shape) of the blank region 13B can be a shape enclosing the periphery of the first region 12 from four directions of front, back, left, and right. More specifically, the shape of the blank region 13B can be a shape in which four arc shapes are connected. Such a blank region 13B can be used as a region where no bumps 11 are arranged, for example, because an error is likely to occur at the time of commercialization.

Furthermore, the blank region 13B in FIG. 11(*a*) can also be referred to as a region formed when the size of the chip cut out from the semiconductor wafer 10 is large. That is, when the size of the chip is small, the first region 12 has a substantially circular shape in the plan view of FIG. 1(*a*). On the other hand, when the size of the chip is large, the first region 12 has a substantially polygonal shape in the plan view of FIG. 11(*a*). Then, when the first region 12 has a substantially polygonal shape in plan view, the blank region 13B in FIG. 11(*a*) is formed so as to enclose the periphery of the first region 12. In a case where the blank region 13B in FIG. 11(*a*) is formed, the size of the chip is, for example, 100 mm² or more.

In the following description, the surface of the blank region 13B is referred to as a "blank region surface 101 A".

An average height H1 of the bumps 11 on the main surface 10A is not particularly limited. The average height H1 can be arbitrarily set according to the type of the bumps 11 such as plated bumps, ball bumps, or printed bumps. Usually, the average height H1 of the bumps 11 on the main surface 10A is preferably less than 350 μm, more preferably in a range of 5 to 250 μm, still more preferably in a range of 10 to 150 μm.

The ratio of the area of the second region 13 to the total area of the main surface 10A is not particularly limited. This ratio can be arbitrarily set depending on the size of the blank region 13B. For example, this ratio can be preferably less than 30%, more preferably 23% or less, still more preferably 15% or less.

The ratio of the area of the main surface 13A to the total area of the peripheral edge region 10A is not particularly limited. Usually, this ratio is preferably 10% or less, more preferably 8% or less, still more preferably 5% or less.

The ratio of the area of the blank region 13B to the total area of the main surface 10A is not particularly limited. Usually, this ratio can be arbitrarily set, and is preferably 20% or less, more preferably 15% or less, still more preferably 10% or less.

In the second region 13, the peripheral edge region 13A and the blank region 13B both have a notched step portion with respect to the first region 12. A dent, recess, or the like following the step portion is formed on the surface of the film 20, and thus may cause defects such as occurrence of a vacuum error, occurrence of a crack, cracking, or the like.

When the peripheral edge region 13A and the blank region 13B are compared with each other, the blank region 13B is larger than the peripheral edge region 13A in terms of the ratio of the area to the total area of the main surface 10A. Hence, a larger dent, recess, or the like is likely to be formed on the surface of a protective film 20 in the blank region 13B than in the peripheral edge region 13A, and the above-described defect is highly likely to be caused.

Therefore, in the following description, the second region 13 will be described, taking the blank region 13B as an example thereof unless otherwise specified.

[3] Protective Film

The protective film 20 used in the present affixing method is a film used in a method for manufacturing a semiconductor component, and, more specifically, a film used in a back grinding step of grinding the semiconductor wafer to a desired thickness in a method for manufacturing a semiconductor component.

That is, the present protective film is a protective film according to the third invention.

As illustrated in FIG. 2, the protective film 20 can include a base layer 21 and an adhesive layer 22.

The protective film 20 preferably has a layer capable of exhibiting fluidity or plasticity from the viewpoint of eliminating unevenness due to the bumps 11 and a step due to a height difference between the first region 12 and the second region 13. The protective film 20 of the present embodiment has an unevenness absorption layer 23 as a layer capable of exhibiting fluidity or plasticity between the base layer 21 and the adhesive layer 22.

An average thickness H2 of the protective film 20 preferably satisfies a relational expression of 0.5≤H2/H1 with an average height H1 of the bumps 11 from the viewpoint of suitably eliminating the unevenness due to the bumps 11 and the step due to the height difference between the first region 12 and the second region 13.

An upper limit of H2/H1 is not particularly limited, from the viewpoint that the protective film 20 absorbs the unevenness due to the bumps 11 and the step due to the height difference between the first region 12 and the second region 13, by virtue of the amount of thickness, to suitably eliminate the unevenness and the step. The H2/H1 is usually 10 or less (H2/H1≤10), preferably 5 or less (H2/H1≤5), more preferably 4 or less (H2/H1≤4) from the viewpoint of suppressing a loss of the material due to the increase in average thickness H2 of the protective film 20 and further suitably maintaining moldability of the protective film 20.

Specifically, the average thickness H2 of the protective film 20 is preferably 30 μm or more, more preferably 100 μm or more, still more preferably 200 μm or more.

Note that the average height H1 is an average value of the actually measured heights of $\frac{1}{10}$ bumps randomly selected among the total number of bumps. The average thickness H2 is an average value of the actually measured thicknesses of the film at 10 places selected so as to be distant from each other by 2 cm or more.

Hereinafter, each layer of the protective film will be described.

(1) Base Layer

The base layer 21 is a layer provided for the purpose of improving characteristics such as handleability, mechanical characteristics, and heat resistance of the protective film 20.

A material used for the base layer 21 is not particularly limited as long as it has mechanical strength capable of withstanding an external force to be applied at the time of grinding the semiconductor wafer in the back grinding step.

Usually, a synthetic resin film is used as the material of the base layer 21.

Examples of the synthetic resin can include one or more thermoplastic resins selected from polyolefins such as polyethylene, polypropylene, poly (4-methyl-1 pentene), and poly (1-butene); polyesters such as polyethylene terephthalate and polybutylene terephthalate; polyamides such as nylon-6, nylon-66, and polymethaxylene adipamide; polyacrylate; polymethacrylate; polyvinyl chloride; polyetherimide; ethylene-vinyl acetate copolymers; polyacrylonitrile; polycarbonate; polystyrene; ionomers; polysulfone; polyethersulfone; polyphenylene ether, and the like.

Among these synthetic resins, one or more selected from polypropylene, polyethylene terephthalate, polyamide, and an ethylene-vinyl acetate copolymer are preferable, and one or more selected from polyethylene terephthalate and an ethylene-vinyl acetate copolymer are more preferable, from the viewpoint of suitably protecting the semiconductor wafer in the back grinding step.

In addition, as an additive, a plasticizer, a softener (mineral oil or the like), a filler (carbonate, sulfate, titanate, silicate, oxide (titanium oxide or magnesium oxide), silica, talc, mica, clay, fiber filler, or the like), an antioxidant, a light stabilizer, an antistatic agent, a lubricant, a colorant, or the like can be added to the synthetic resin. These adhesives may be used singly, or two or more thereof may be used in combination.

As the film described above, any stretched film such as an unstretched film, a uniaxially stretched film, or a biaxially stretched film can be used regardless of whether the film is stretched, but a stretched film is preferable from the viewpoint of improving mechanical strength.

As the film, either a monolayer film or a multilayer film having a plurality of layers can be used.

For the base layer 21, it is preferable to use a surface-treated film from the viewpoint of improving adhesiveness to the unevenness absorption layer 23 and the like. Specific examples of the surface treatment include a corona treatment, a plasma treatment, an undercoat treatment, and a primer coating treatment.

The thickness of the base layer 21 is not particularly limited, but is preferably 10 to 200 μm, more preferably 20 to 150 μm, still more preferably 30 to 100 μm from the viewpoint of obtaining good characteristics.

(2) Adhesive Layer

The adhesive layer 22 is a layer provided for the purpose of affixing and fixing the protective film 20 to the main surface 10A of the semiconductor wafer 10.

A material of the adhesive layer 22 is not particularly limited, but one containing at least an adhesive main agent is used. Examples of the adhesive main agent can include a (meth)acrylic adhesive, a silicone-based adhesive, a urethane-based adhesive, and a rubber-based adhesive.

The material of the adhesive layer 22 may contain a crosslinking agent in addition to the adhesive main agent.

As a material of the adhesive layer 22, either an energy ray-curable adhesive that can be cured by energy rays or an energy ray-non-curable adhesive that is not cured by energy rays can be used. Among them, the energy ray-curable adhesive material is preferable as a material of the adhesive layer 22, from the viewpoint that it is cured by energy ray irradiation to reduce the adhesive force so that the protective film 20 can be peeled off from the main surface 10A without adhesive residue.

Regarding the energy ray-curable adhesive material, the type of the energy ray is not particularly limited, and examples thereof include ultraviolet rays, electron beams, and infrared rays.

In addition to the adhesive main agent, the energy ray-curable adhesive material may contain a compound having a carbon-carbon double bond in the molecule and a photo-polymerization initiator capable of initiating polymerization of the curable compound in response to energy rays. The curable compound is preferably a monomer, oligomer, or polymer having a carbon-carbon double bond in the molecule and being curable by radical polymerization.

The adhesive force of the adhesive layer 22 is not particularly limited, but it is preferable that the adhesive force thereof to the silicon wafer, as measured in accordance with JIS Z0237 when the adhesive layer 22 is affixed to the surface of the silicon wafer, left standing for 60 minutes, and then peeled off from the surface of the silicon wafer, should be 0.1 to 10 N/25 mm (measured in an environment at a temperature of 23° C. and a relative humidity of 50%), from the viewpoint of being able to suppress adhesive residue on the semiconductor wafer at the time of peeling while ensuring good adhesiveness to the semiconductor wafer. The adhesive force is more preferably 0.2 to 9 N/25 mm, still more preferably 0.3 to 8 N/25 mm.

The thickness of the adhesive layer 22 is not particularly limited, but is preferably 1 to 50 μm, more preferably 2 to 45 μm, still more preferably 3 to 40 μm, from the viewpoint that the adhesive layer 22 can be peeled off without adhesive residue while exhibiting suitable adhesive strength.

(3) Unevenness Absorption Layer

The unevenness absorption layer 23 is a layer having unevenness absorption property exhibited upon exhibition of fluidity or plasticity. The unevenness absorption layer 23 is provided for the purpose of smoothing the surface of the protective film 20 by absorbing the unevenness caused by the bumps 11 arranged on the main surface 10A and by filling in the steps due to a height difference between the first region 12 and the second region 13.

The material of the unevenness absorption layer 23 is not particularly limited as long as it has unevenness absorption property upon exhibition of fluidity or plasticity.

A thermoplastic resin is usually used as a material of the unevenness absorption layer 23.

Specific examples of the thermoplastic resin include an olefin-based resin, an ethylene-polar monomer copolymer, an ABS resin, a vinyl chloride resin, a vinylidene chloride resin, a (meth)acryl-based resin, a polyamide-based resin, a fluorine-based resin, a polycarbonate-based resin, and a polyester-based resin. Among them, at least one selected from an olefin-based resin and an ethylene-polar monomer copolymer is preferable from the viewpoint of good unevenness absorption property.

Examples of the olefin-based resin include linear low density polyethylene (LLDPE), low density polyethylene, high density polyethylene, polypropylene, an ethylene-α-olefin copolymer containing ethylene and an α-olefin having 3 to 12 carbon atoms, a propylene-α-olefin copolymer containing propylene and an α-olefin having 4 to 12 carbon atoms, an ethylene-cyclic olefin copolymer, and an ethylene-α-olefin-cyclic olefin copolymer.

Examples of the ethylene-polar monomer copolymer include ethylene-unsaturated carboxylic acid ester copolymers such as an ethylene-ethyl (meth)acrylate copolymer, an ethylene-methyl (meth)acrylate copolymer, an ethylene-propyl (meth)acrylate copolymer, and an ethylene-butyl (meth) acrylate copolymer; and ethylene-vinyl ester copolymers such as an ethylene-vinyl acetate copolymer, an ethylene-vinyl propionate copolymer, an ethylene-vinyl butyrate copolymer, and an ethylene-vinyl stearate copolymer.

The thermoplastic resins described above may be used alone, or two or more thereof may be used in combination.

The density of the unevenness absorption layer 23 is not particularly limited, but is preferably 800 to 990 kg/m$^3$, more preferably 830 to 980 kg/m$^3$, still more preferably 850 to 970 kg/m$^3$ from the viewpoint of the balance (rigidity and flexibility) between the flexibility associated with the unevenness absorption property and the rigidity associated with the durability in the back grinding step.

The thickness of the unevenness absorption layer 23 is not particularly limited as long as the unevenness absorption property for the unevenness shape due to the bumps 11 and the step due to the height difference between the first region 12 and the second region 13 can be exhibited, but is preferably 20 μm or more, more preferably 80 μm or more, still more preferably 170 μm or more from the viewpoint that the unevenness absorption property can be suitably exhibited.

A storage elastic modulus G' (60) of the unevenness absorption layer 23 at 60° C. is preferably $0.05 \times 10^6$ to $1.0 \times 10^6$ Pa, more preferably $0.075 \times 10^6$ to $0.5 \times 10^6$ Pa from the viewpoint that the unevenness absorption layer 23 can exhibit suitable unevenness absorption property by heating at the time of bonding the protective film 20.

A storage elastic modulus G' (25) of the unevenness absorption layer 23 at 25° C. is preferably $4.0 \times 10^6$ to $7.0 \times 10^6$ Pa, more preferably $4.5 \times 10^6$ to $6.5 \times 10^6$ Pa from the viewpoint that the unevenness absorption layer 23 can retain its shape and maintain suitable adhesion to the main surface 10A after the protective film 20 is bonded.

An elastic modulus ratio G' (25)/G' (60) between the storage elastic modulus G' (60) and the storage elastic modulus G' (25) of the unevenness absorption layer 23 is preferably G' (60)/G' (25)<0.1, more preferably G' (60)/G' (25)≤0.08, still more preferably G' (60)/G' (25)≤0.05 from the viewpoint that good unevenness absorption property can be exhibited and that good adhesion to the main surface 10A can be maintained.

The storage elastic modulus G' is measured using a dynamic viscoelasticity measuring device (for example, "RMS-800" manufactured by Rheometrics, Inc.) under the conditions of a measurement frequency of 1 Hz and a strain of 0.1 to 3%, G' (25) is measured at 25° C., and the storage elastic modulus G' (60) is measured at 60° C.

(4) Other Layers

The protective film 20 is not limited to the configuration including the base layer 21, the adhesive layer 22, and the unevenness absorption layer 23 described above, and may be configured to include any other layer between the base layer 21 and the unevenness absorption layer 23 or between the unevenness absorption layer 23 and the adhesive layer 22.

Examples of the other layer include an interface strength improving layer that improves interface strength with the adhesive layer 22, a migration prevention layer that suppresses migration of a low molecular weight component to the adhesive surface of the adhesive layer 22, and an antistatic layer that prevents electrification of the protective film 20. These may be used singly, or two or more thereof may be used in combination.

[4] Affixing Apparatus

The affixing apparatus 30 is not particularly limited as long as it can execute the arrangement step S1, the affixing step S2, and the compression step S3.

The following configuration can be exemplified as that of the affixing apparatus affixing apparatus 30.

As illustrated in FIGS. 3(*a*) and (*b*), the affixing apparatus 30 includes a chuck table 31, a pressing member 32 arranged at a position above the chuck table 31, and a support member 33 arranged beside the chuck table 31.

The chuck table 31 is for supporting and fixing the semiconductor wafer 10 mounted on its surface.

The pressing member 32 is for pressing the protective film 20 against the main surface 10A of the semiconductor wafer 10 supported and fixed on the chuck table 31.

The support member 33 is installed along the outer peripheral edge of the second region 13 of the semiconductor wafer 10 supported and fixed on the chuck table 31, and is for supporting an edge part of the protective film 20.

The affixing apparatus affixing apparatus 30 can be configured to include a heating device for heating the protective film 20 from the viewpoint of suitably exhibiting fluidity or plasticity in the unevenness absorption layer 23 of the protective film 20. As the heating device, a hot air heater or the like can be exemplified.

The affixing apparatus 30 can be configured to include a supply device that supplies the protective film 20 into the apparatus from the viewpoint that the arrangement step S1 can be suitably executed. Examples of the supply device can include a film supply roller and a film supply arm.

Hereinafter, each member included in the affixing apparatus will be described.

(1) Chuck Table

A type, a configuration, and the like of the chuck table 31 are not particularly limited as long as it can support and fix the semiconductor wafer 10.

The chuck table 31 is preferably a vacuum suction table from the viewpoint that it can suitably fix the semiconductor wafer 10 and prevent contamination and damage of the semiconductor wafer 10.

(2) Pressing Member

A shape, a configuration, and the like of the pressing member 32 are not particularly limited as long as it can press the protective film 20 against the main surface 10A of the semiconductor wafer 10.

The pressing member 32 illustrated in FIGS. 3(*a*) and (*b*) is formed in a disk shape, is arranged at a position above the semiconductor wafer 10 supported and fixed on the chuck table 31, and is configured to be able to approach or separate from the semiconductor wafer 10.

In the pressing member 32, from the viewpoint of flattening the surface of the protective film 20 affixed to the main surface 10A of the semiconductor wafer 10, the pressing surface 32A that presses the protective film 20 is preferably a flat surface.

A hardness of the pressing surface 32A is preferably 2.5 to 8.5, more preferably 3 to 7, still more preferably 4 to 6 in Mohs hardness from the viewpoint of suppressing deformation when the protective film 20 is pressed to maintain flatness of the pressing surface 32A.

A material of the pressing surface 32A is not particularly limited, but, from the viewpoint of satisfying the Mohs hardness, a metal such as iron, copper, aluminum, steel, stainless steel, or an aluminum alloy, or an inorganic material such as glass or ceramics can be used.

For example, the pressing member 32 can be configured such that only the pressing surface 32A is formed of the inorganic material, and that the portion other than the pressing surface 32A is formed of a synthetic resin.

A configuration and the like of bringing the pressing member 32 close to or separate from the semiconductor wafer 10 are not particularly limited.

For example, the pressing member 32 can be configured such that one end edge is turnably attached to the affixing apparatus 30, and configured to approach the semiconductor wafer 10 when being flipped down, and to separate from the semiconductor wafer 10 when being flipped up.

In addition, the pressing member 32 can be attached to a rail or the like provided in the affixing apparatus 30 so as to extend in the thickness direction of the semiconductor wafer 10 in such a manner that it can be freely raised or lowered, and configured to approach the semiconductor wafer 10 when being lowered and to separate from the semiconductor wafer 10 when being raised.

In addition, the pressing member 32 is fixed at a position above the chuck table 31, and the chuck table 31 can be configured to be able to be freely raised or lowered, and can also be configured in such a manner that the semiconductor wafer 10 approaches the pressing member 32 when the chuck table 31 is raised, and that the semiconductor wafer 10 separates from the pressing member 32 when the chuck table 31 is lowered.

(3) Support Member

A configuration and the like of the support member 33 are not particularly limited as long as the protective film 20 can be compressed in the compression step S3.

A shape of the support member 33 is not particularly limited as long as it can be installed along the outer peripheral edge of the second region 13 of the semiconductor wafer 10 and the compression step S3 can be suitably executed. Examples of such a shape include an annular shape, a fan shape, and an arc shape in plan view.

A material of the support member 33 is not particularly limited as long as the protective film 20 can be sandwiched between it and the pressing member 32 to be compressed. Examples of such a material can include thermoplastic resins such as engineering plastics and super engineering plastics, and thermosetting resins, in addition to the inorganic materials such as metals listed for the pressing member 32.

The support member 33 illustrated in FIGS. 3(*a*) and (*b*) is formed in an annular shape in plan view so that the entire semiconductor wafer 10 can be enclosed inside.

When a shape of the support member 33 is a fan shape, an arc shape, or the like in plan view, it is preferable to install the support member 33 particularly along an outer peripheral edge of the blank region 13B in the second region 13.

As illustrated in FIG. 6, the support member 33 requires a certain width $W_1$ or more in plan view, and thus it is possible to exert an action of the protective film 20, that is, an action of filling the step in the blank region 13B with a portion sandwiched between the pressing member 32 and the support member 33.

The volume required to fill the step is appropriately adjusted according to conditions such as a height of the bumps 11, an area of the blank region 13B occupying the main surface 10A of the semiconductor wafer 10, and a thickness of the protective film 20.

Therefore, the width $W_1$ of the support member 33 in plan view is not particularly limited, but is generally preferably 1 to 20 mm, more preferably 2 to 15 mm, still more preferably 3 to 10 mm from the viewpoint that the protective film 20 can be reliably sandwiched between it and the pressing member 32 to be compressed.

A support surface 33A supporting the edge part of the protective film 20 in the support member 33 is parallel to the main surface 10A of the semiconductor wafer 10 from the viewpoint of suitably moving the thickness (for example, the unevenness absorption layer 23) of the edge part of the protective film 20 compressed in the compression step S3 to the second region 13 of the main surface 10A of the semiconductor wafer 10, particularly to a blank region surface 101A of the blank region 13B.

Figure 9:
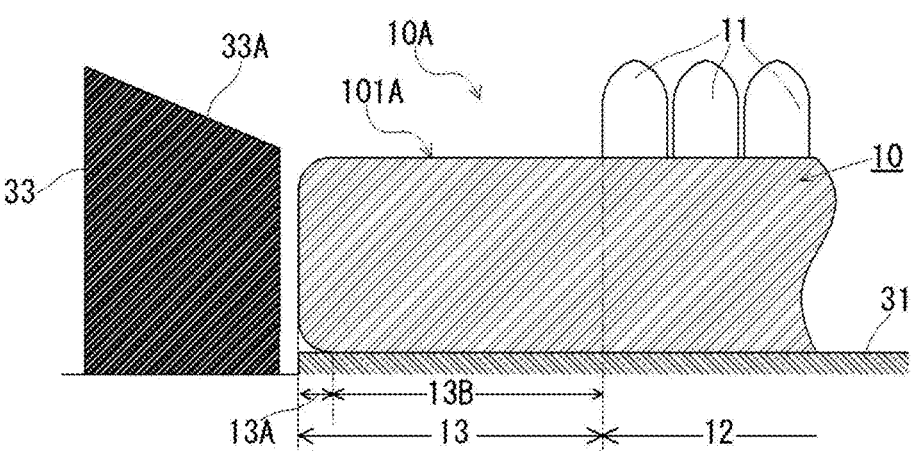
FIG. 9 is an enlarged side cross-sectional view for explaining a modification of a support member according to the affixing method of the first invention.

Alternatively, as illustrated in FIG. 9, the support surface 33A of the support member 33 may be inclined so as to face the main surface 10A side of the semiconductor wafer 10 from the viewpoint of more suitably moving the thickness (for example, the unevenness absorption layer 23) of the edge part of the protective film 20 compressed in the compression step S3 onto the blank region surface 101A.

Figures 3A, 3B:
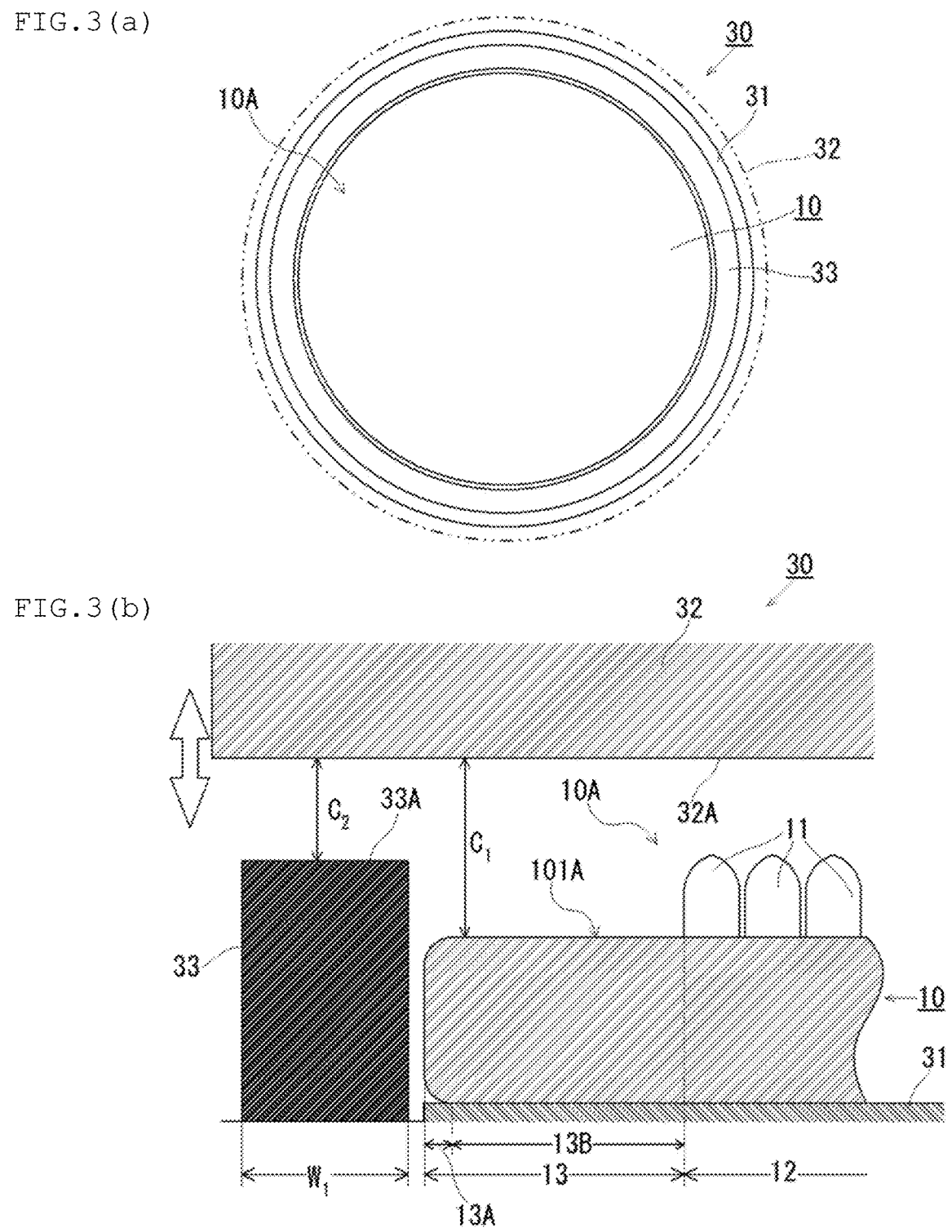
FIG. 3(a) is a plan view and FIG. 3(b) is an enlarged side cross-sectional view, for explaining an affixing apparatus affixing apparatus according to an affixing method of a first invention.

In the affixing apparatus 30 illustrated in FIGS. 3(a) and (b), $C_1 > C_2$, where a clearance between the main surface 10A of the semiconductor wafer 10 and the pressing member 32 is $C_1$, and a clearance between the support member 33 and the pressing member 32 is $C_2$, from the viewpoint that the compression step S3 can be suitably executed. In a case of $C_1 > C_2$, the support surface 33A of the support member 33 is arranged at a position higher than the blank region surface 101A on the main surface 10A of the semiconductor wafer 10.

Note that the clearance $C_1$ and the clearance $C_2$ can also have a relationship of $C_1 = C_2$ or $C_1 < C_2$. In a case of $C_1 = C_2$, the support surface 33A of the support member 33 is arranged at the same height as the surface of the second region 13 of the semiconductor wafer 10, and in a case of $C_1 < C_2$, the support surface 33A of the support member 33 is arranged at a position lower than the surface of the second region 13 of the semiconductor wafer 10.

Figure 12A:
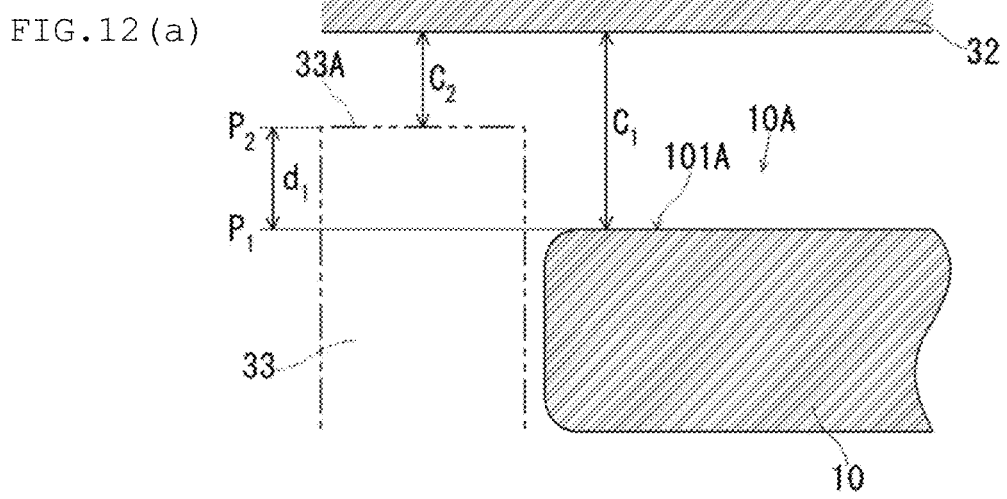
FIGS. 12(a) and (b) are enlarged side cross-sectional views for explaining a relationship between a clearance $C_1$ of the semiconductor wafer and a clearance $C_2$ of the support member, with respect to a pressing member, according to the affixing method of the first invention.

More specifically, in a case where a position of the blank region surface 101A in the thickness direction of the semiconductor wafer 10 is $P_1$, a position of the support surface 33A of the support member 33 is $P_2$, and a distance between $P_1$ and $P_2$ is $d_1$ (µm), when $C_1$ and $C_2$ satisfy $C_1 > C_2$ (see FIG. 12(a)), it is preferable that $50 \leq d_1$ (µm)$\leq 2000$, and it is more preferable that $100 \leq d_1$ (µm)$\leq 1000$.

Figure 12B:
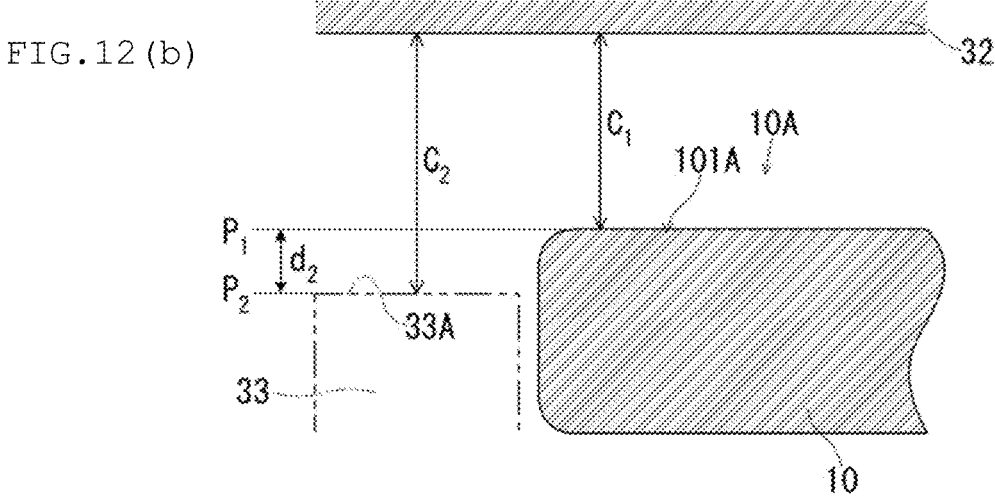

Similarly, in a case where the position of the blank region surface 101A in the thickness direction of the semiconductor wafer 10 is $P_1$, the position of the support surface 33A of the support member 33 is $P_2$, and the distance between $P_1$ and $P_2$ is $d_2$ (µm), when $C_1$ and $C_2$ satisfy $C_1 < C_2$ (see FIG. 12(b)), it is preferable that $0 \leq d_2$ (µm)$\leq 400$, it is more preferable that $10 \leq d_2$ (µm)$\leq 300$, and it is still more preferable that $50 \leq d_2$ (µm)$\leq 200$.

[5] Arrangement Step

As illustrated in FIGS. 4(a) and (b), the arrangement step S1 is a step of supplying the protective film 20 onto the main surface 10A of the semiconductor wafer 10 in a state where the pressing member 32 (not illustrated) is separated from the semiconductor wafer 10.

Figure 5:
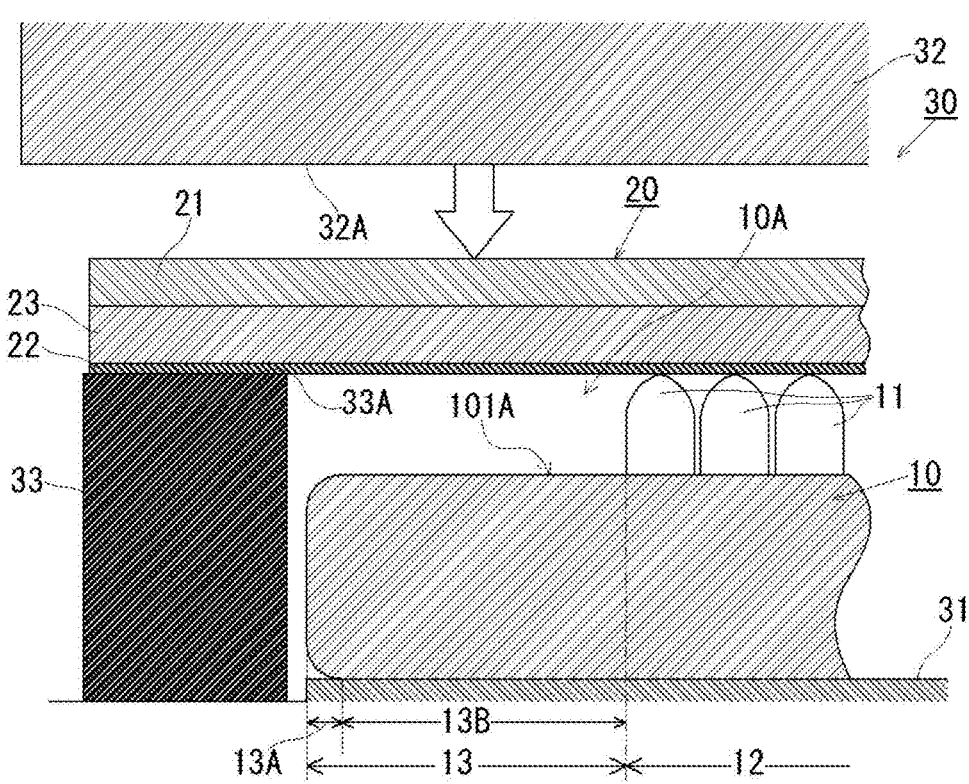
FIG. 5 is an enlarged side cross-sectional view for explaining an affixing step according to the affixing method of the first invention.

In the arrangement step S1, the supplied protective film 20 is arranged so as to cover the main surface 10A of the semiconductor wafer 10 (see FIGS. 4(b) and 5).

A shape of the protective film 20 to be supplied is not particularly limited, and any of a circular shape, a square shape, a rectangular shape, and a band shape in plan view can be used.

A method for supplying the protective film 20 is not particularly limited, and either a batch method in which the protective film 20 is supplied one by one or a continuous method in which the protective film 20 is continuously supplied can be used.

In the arrangement step S1 illustrated in FIGS. 4(a) and (b), the shape of the protective film 20 to be supplied is circular in plan view according to the main surface 10A, and the method for supplying the protective film 20 is a batch method.

In arrangement step S1, the protective film 20 is arranged such that the edge part (peripheral edge part) of protective film 20 protrudes outward from the peripheral edge of second region 13, from two viewpoints of replenishment with the amount of thickness sufficient to adequately fill the step over entire second region 13 and suitable restriction of the flow of the thick portion further outward from the peripheral edge of main surface 10A.

A protruding amount of the edge part of the protective film 20 is not particularly limited. From the viewpoint of reliably performing the compression step S3, the protruding amount is preferably set to an amount which allows the protruding edge part to be placed on the support surface 33A of the support member 33.

As illustrated in FIG. 6, in order to exert the action of the protective film 20, that is, the action of filling the step in the blank region 13B with the portion sandwiched between the pressing member 32 and the support member 33, it is preferable that the protruding amount of the edge part of the protective film 20 should have a certain width $W_2$ or more in plan view and allows the protruding edge part to be placed on the support surface 33A of the support member 33.

The volume required to fill the step is appropriately adjusted according to conditions such as a height of the bumps 11, an area of the blank region 13B occupying the main surface 10A of the semiconductor wafer 10, and a thickness of the protective film 20.

For this reason, regarding the protruding amount of the edge part of the protective film 20, the width $W_2$ in plan view is not particularly limited, but, from the viewpoint of reducing an amount of the protective film 20 to be discarded as a surplus, in general, it is more preferable to set the protruding amount to an amount which allows the edge part not to protrude further outward from a peripheral edge of the support surface 33A.

Specifically, regarding the protruding amount of the edge part of the protective film 20, when a length between a position corresponding to the peripheral edge of the main surface 10A on the protective film 20 and an outer peripheral edge of the protective film 20 is the width $W_2$ in plan view described above, the width $W_2$ is preferably 0.5 to 10 mm, more preferably 1 to 8 mm, still more preferably 1.5 to 6 mm.

[6] Affixing Step

In the affixing step S2, as illustrated in FIG. 5, the pressing member 32 is brought close to the main surface 10A of the semiconductor wafer 10, and the protective film 20 is pressed against the main surface 10A by the pressing member 32 to be affixed.

The affixing step S2 includes the compression step S3 of compressing the protective film 20 in its thickness direction.

An execution timing of the compression step S3 in the affixing step S2 is not particularly limited, and, for example, the start time of the compression step S3 may be after the start of the affixing step S2, the end time of the compression step S3 and the end time of the affixing step S2 may be substantially simultaneous, and the end time of the compression step S3 may be before the end of the affixing step S2.

In the affixing step S2, by heating the protective film 20 using the heating device of the affixing apparatus 30, the thick portion (unevenness absorption layer 23) of the protective film 20 can be suitably deformed in the compression step S3.

A heating temperature of the protective film 20 is not particularly limited as long as it is set to a temperature at which the unevenness absorption layer 23 can be suitably deformed according to the storage elastic modulus G' of the unevenness absorption layer 23 described above.

Specifically, the heating temperature of the protective film 20 is preferably 50 to 200° C., more preferably 60 to 100° C., still more preferably 70 to 90° C. as long as the storage elastic modulus G' of the unevenness absorption layer 23 is in the range described above.

(1) Compression Step

As illustrated in FIG. 6, in the compression step S3, the edge part of the protective film 20 is supported by the support member 33, and sandwiched between the support member 33 and the pressing member 32 to be compressed.

A compressive force at the time of compressing the edge part of the protective film 20 can be set by a pressing force by the pressing member 32. The specific pressing force is preferably 0.3 to 2 MPa, more preferably 0.4 to 1.5 MPa, still more preferably 0.5 to 1 MPa from the viewpoint of suitably compressing the edge part of the protective film 20 and preventing cracking and occurrence of cracks of the semiconductor wafer 10.

In the compression step S3, on the first region 12 of the main surface 10A, the thick portion (unevenness absorption layer 23) of the protective film 20 sandwiched between the pressing member 32 and the bumps 11 and crushed in the thickness direction is deformed following the unevenness of the bumps 11 to fill the unevenness.

Then, a part of the thick portion of the protective film 20 crushed in the thickness direction flows onto the blank region 13B of the second region 13 as indicated by an arrow on the right side in FIG. 6, so that the amount of thickness of the protective film 20 on the blank region surface 101A is increased.

On the other hand, the edge part of the protective film 20 sandwiched between the support member 33 and the pressing member 32 to be compressed in the thickness direction is flowed in such a manner that the thick portion (unevenness absorption layer 23) is squeezed out onto the blank region surface 101A as indicated by an arrow on the left side in FIG. 6, thereby increasing the amount of thickness of the protective film 20 on the blank region surface 101A.

In addition, the edge part of the protective film 20 compressed in the thickness direction prevents the thick portion from being escaped further outward from the peripheral edge of the second region 13 by the support member 33 and the pressing member 32 restricting the flow of the thick portion from the blank region surface 101A.

Therefore, the thick portion flows into the protective film 20 on the blank region surface 101A from the first region 12 and the compressed edge part, leading to replenishment with a sufficient amount of thickness to fill the step over the entire second region 13. As described above, in the protective film 20 on the blank region surface 101A replenished with the amount of thickness, the step over the entire second region 13 is filled by increasing the thickness.

In addition, since the surface of the protective film 20 is in a state of being pressed by the pressing member 32, the surface becomes flat following the pressing surface 32A without being affected by the flow of the thick portion.

After the compression step S3, the semiconductor wafer 10 having the protective film 20 affixed to the main surface 10A is taken out from the affixing apparatus 30, and a surplus portion such as the edge part of the compressed protective film 20 is cut off.

Figure 7:
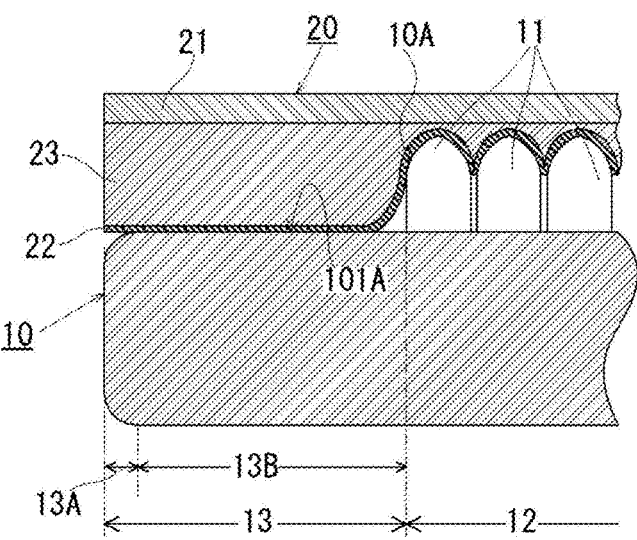
FIG. 7 is an enlarged side cross-sectional view for explaining a semiconductor wafer to which a protective film according to the affixing method of the first invention is affixed.
Figure 8:
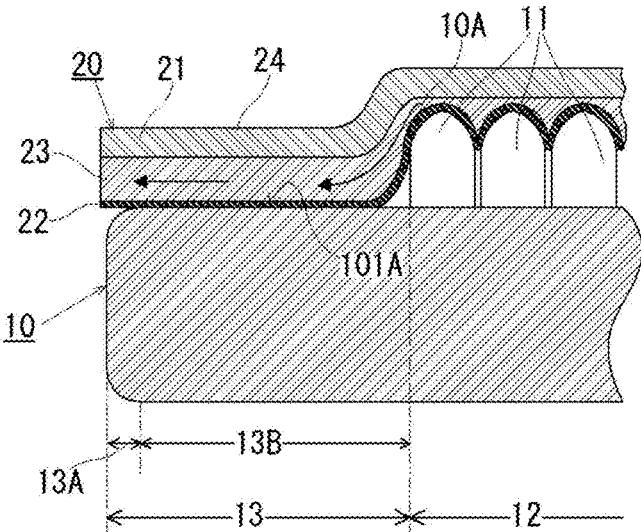
FIG. 8 is an enlarged side cross-sectional view for explaining a semiconductor wafer to which a protective film according to a general affixing method is affixed.

In the semiconductor wafer 10 from which the surplus portion has been cut off, as illustrated in FIG. 7, the thick portion of the protective film 20 is thickly offset on the blank region surface 101A to fill the step.

In the above description, explanation has been made, taking the blank region 13B as an example of the second region 13. However, similarly as in the blank region 13B, the thick portion of the protective film 20 is thickly offset on the second region 13 to fill the step, in the peripheral edge region 13A.

The surface of the protective film 20 affixed to the semiconductor wafer 10 becomes a uniform flat surface as a whole without forming a defect following the step of the semiconductor wafer 10.

Figure 11A:
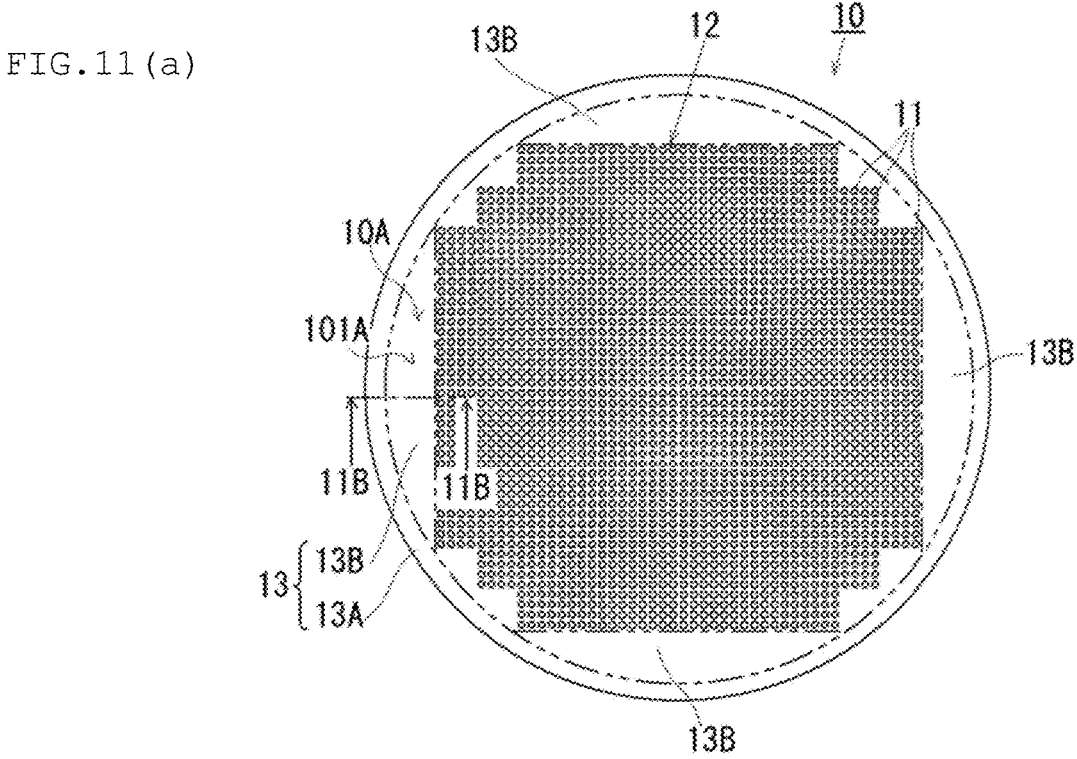
FIG. 11(a) is a plan view and FIG. 11(b) is an enlarged side cross-sectional view taken along a line 11B-11B in FIG. 11(a), for explaining another example of the semiconductor wafer to be subjected to the affixing method of the present invention.
Figure 11B:
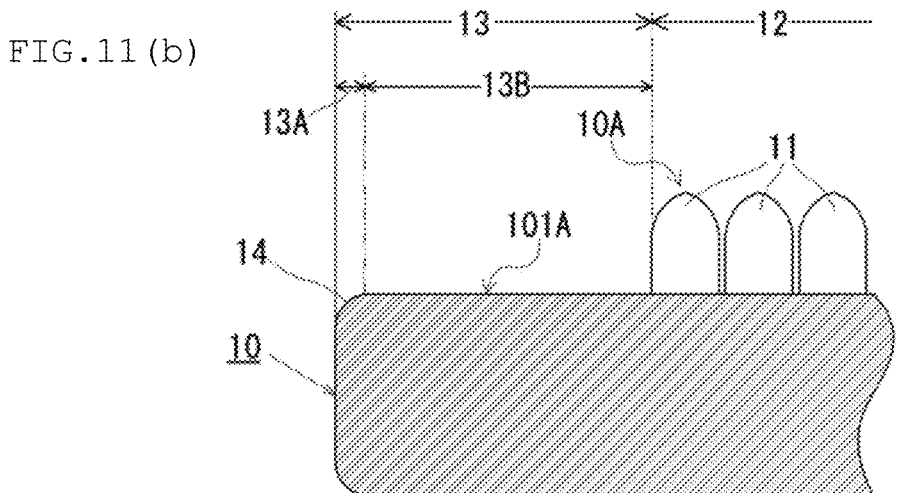

Note that, explanation has been made, taking, as an example, the blank region 13B mainly used as the identification region as illustrated in FIGS. 1(a) and (b) in the above-described present affixing method, but the same effects can be obtained also in the blank region 13B as illustrated in FIGS. 11(a) and 11(b).

That is, the present affixing method is particularly useful in a case where the target semiconductor wafer 10 includes the blank region 13B having the flat blank region surface 101A in the second region 13 which is a region where no bumps are arranged.

[7] Affixing Method (Second Embodiment)

The present affixing method is a second embodiment according to the first invention.

The present affixing method (second embodiment) is included in the method for manufacturing a semiconductor component according to the second invention, similarly to the first embodiment.

The semiconductor wafer 10 and the protective film 20 to be subjected to the present affixing method are as described in the above section "[2] Semiconductor wafer" and the above section "[3] Protective film", and the description thereof will be omitted.

The affixing method of the second embodiment is different from that of the first embodiment in arrangement step and compression step. Hereinafter, the arrangement step and the compression step of the present affixing method will be described.

(1) Arrangement Step

Figure 13A:
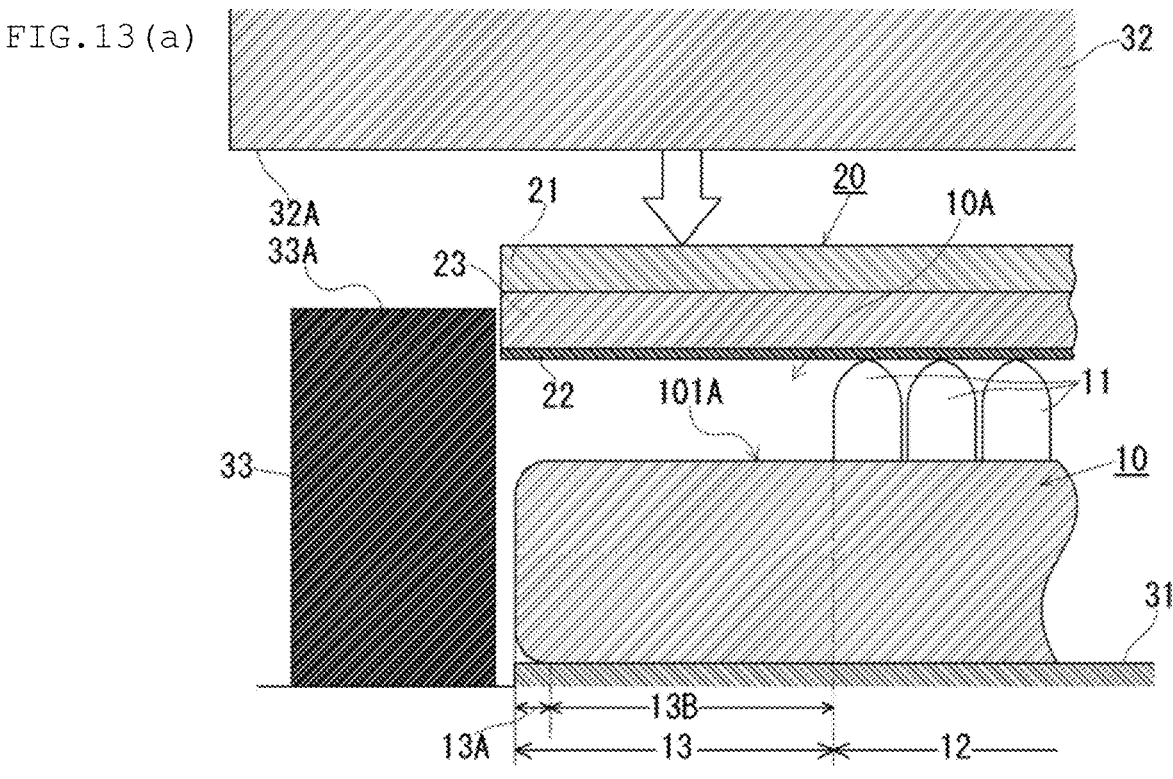
FIG. 13(a) is an enlarged side cross-sectional view for explaining the arrangement step, and Fig. (b) is an enlarged side cross-sectional view for explaining the compression step, according to the affixing method of the first invention.
Figure 13B:
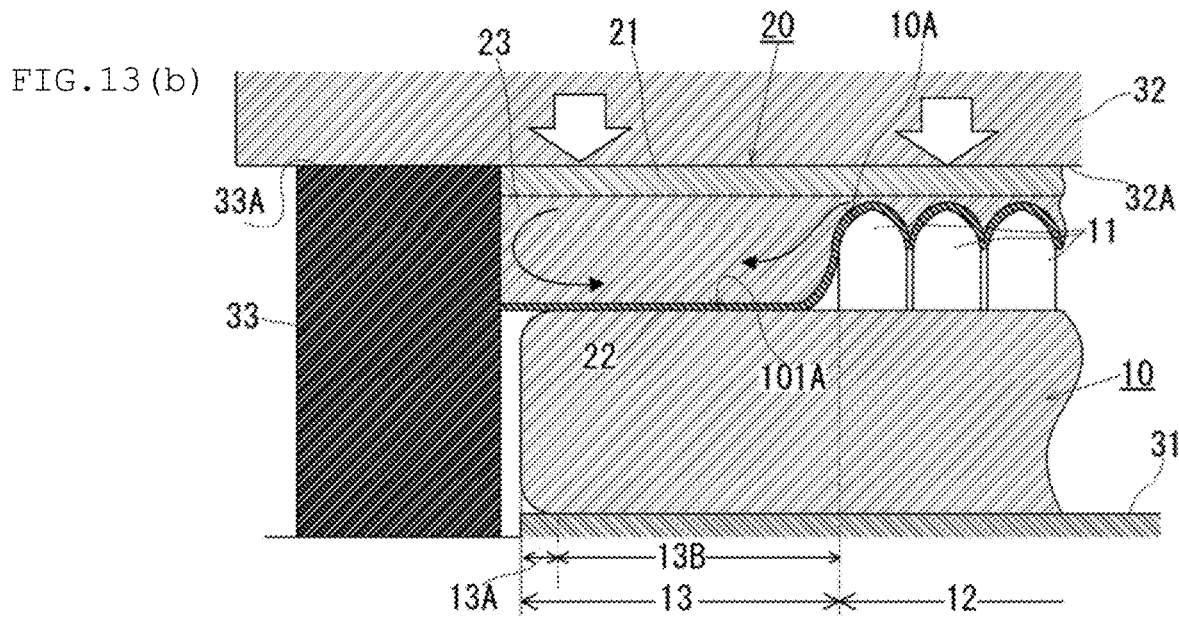

As illustrated in FIG. 13 (a), the arrangement step S1 described above can be a step of arranging the protective film 20 such that the edge part (peripheral edge part) of the protective film 20 is positioned on an inner peripheral side of the support member 33. In this arrangement step S1, the edge part of the protective film 20 is not placed on the support surface 33A of the support member 33.

In this arrangement step S1, in order to block the bulging of the protective film 20 in an outer peripheral direction of the second region 13 caused in the compression step S3 which will be described below with an inner peripheral surface of the support member 33, it is desirable to shorten the distance between the edge part of the protective film 20 and the inner peripheral surface of the support member 33 in plan view as much as possible.

Specifically, a distance between the edge part of the protective film 20 and the inner peripheral surface of the support member 33 in plan view is preferably less than 1 mm, more preferably 0.5 mm or less, still more preferably 0.3 mm or less. Most preferably, the distance between the edge part of the protective film 20 and the inner peripheral surface of the support member 33 in plan view is 0 mm, that is, the edge part of the protective film 20 is in contact with the inner peripheral surface of the support member 33.

(2) Compression Step

In the compression step S3 after the arrangement step S1, the protective film 20 sandwiched between the pressing member 32 and the main surface 10A tries to bulge the thick portion (unevenness absorption layer 23) from its edge part (peripheral edge part) in the outer peripheral direction of the second region 13. The bulging of the thick portion (unevenness absorption layer 23) is blocked with the inner peripheral surface of the support member 33 as indicated by an arrow on the left side in FIG. 13(*b*).

In the edge part of the protective film 20, the thick portion (unevenness absorption layer 23) blocked with the inner peripheral surface of the support member 33 remains on the blank region surface 101A, and the thick portion flows from the first region 12 onto the blank region surface 101A, leading to replenishment with the amount of thickness sufficient to fill the step over the entire second region 13.

The thickness of the edge part of the protective film 20 on the blank region surface 101A is increased by replenishment with the amount of thickness. Therefore, the compression step S3 is a step of compressing the edge part of the protective film 20 by the pressing surface 32A of the pressing member 32, the inner peripheral surface of the support member 33, and the main surface 10A of the semiconductor wafer 10. Over the entire second region 13, the step is filled with the edge part of the compressed protective film 20.

The semiconductor wafer 10 to which the protective film 20 is affixed by the present affixing method has a desired thickness in a back grinding step, is divided into individual pieces, and is subjected to various types of processing to manufacture a semiconductor component from the semiconductor wafer 10. That is, the present affixing method is included in the method for manufacturing a semiconductor component.

With regard to the affixing method of the present application, when the first embodiment and the second embodiment are compared, the embodiments are different in that the edge part of the protective film 20 is compressed and crushed between the support member 33 and the pressing member 32 in the first embodiment, whereas the bulging of the protective film 20 is blocked with the inner peripheral surface of the support member 33 without compressing the edge part of the protective film 20 between the support member 33 and the pressing member 32 in the second embodiment. When the protective film 20 has a layer capable of exhibiting fluidity or plasticity, that is, the unevenness absorption layer 23, the effects obtained by this difference can be more remarkably produced.

That is, when the protective film 20 has a layer (unevenness absorption layer 23) capable of exhibiting fluidity or plasticity and the affixing method of the first embodiment is implemented, the layer (unevenness absorption layer 23) constituting the edge part is caused to flow and extruded to the second region 13 of the main surface 10A, so that not only the portion extruded from the first region 12 but also the portion extruded from the edge part outside the second region 13 can be used to replenish the amount of thickness. In other words, briefly, in the affixing method of the first embodiment, the unevenness absorption layer 23 of the protective film 20 is extruded from both the inner peripheral edge part and the outer peripheral edge part of the peripheral edge part enclosing the second region 13 to this second region 13 to fill the step.

On the other hand, when the protective film 20 has a layer (unevenness absorption layer 23) capable of exhibiting fluidity or plasticity and the affixing method of the second embodiment is implemented, the layer (unevenness absorption layer 23) constituting the edge part cannot be caused to flow or extruded to the second region 13 of the main surface 10A, and it is necessary to replenish the amount of thickness only with the portion extruded from the first region 12. In other words, briefly, in the affixing method of the second embodiment, the unevenness absorption layer 23 of the protective film 20 is extruded from only the inner peripheral edge part of the peripheral edge part enclosing the second region 13 to this second region 13 to fill the step.

Therefore, when the protective film 20 has a layer (unevenness absorption layer 23) capable of exhibiting fluidity or plasticity, the first embodiment can also correspond to the semiconductor wafer 10 having a larger blank region 13B and can be said to be more advantageous than the second embodiment, in that the layer (unevenness absorption layer 23) constituting the edge part outside the second region 13 can be used to fill the step of the second region 13.

[8] Affixing Method (Third Embodiment)

The present affixing method is a third embodiment according to the fourth invention.

The semiconductor wafer 10 to be subjected to the present affixing method (third embodiment) is the same as that to be subjected to the affixing method of each of the above-described embodiments, and the details thereof are as described in the above section "[2] Semiconductor wafer", and thus, the description thereof is omitted.

The protective film 20 to be subjected to the present affixing method (third embodiment) is the same as that to be subjected to the affixing method of each of the above-described embodiments, and the details thereof are as described in the above section "[3] Protective film", and thus, the description thereof is omitted. That is, the protective film 20 is also a protective film according to the sixth invention.

The present affixing method (third embodiment) includes a processing step S11 (see FIGS. 14(*a*) and (*b*)) of processing the protective film 20 to prepare a processed film 20A, an arrangement step S12 (see FIG. 15) of arranging the processed film 20A so as to cover the main surface 10A of the semiconductor wafer 10, and an affixing step S13 (see FIG. 16) of pressing the processed film 20A against the main surface 10A to affix the processed film 20A to the main surface 10A.

The processing step S11 is a step of forming sites different in thicknesses in the protective film 20 to prepare the processed film 20A.

The arrangement step S12 is a step of arranging a region 201 having a relatively large thickness among the sites different in thicknesses of the processed film 20A such that it corresponds to the second region 13.

The semiconductor wafer 10 to which the protective film 20 is affixed by the present affixing method has a desired thickness in a back grinding step, is divided into individual pieces, and is subjected to various types of processing to manufacture a semiconductor component from the semiconductor wafer 10.

That is, the present affixing method (third embodiment) is included in a method for manufacturing a semiconductor component according to the fifth invention.

Figures 14A, 14B:
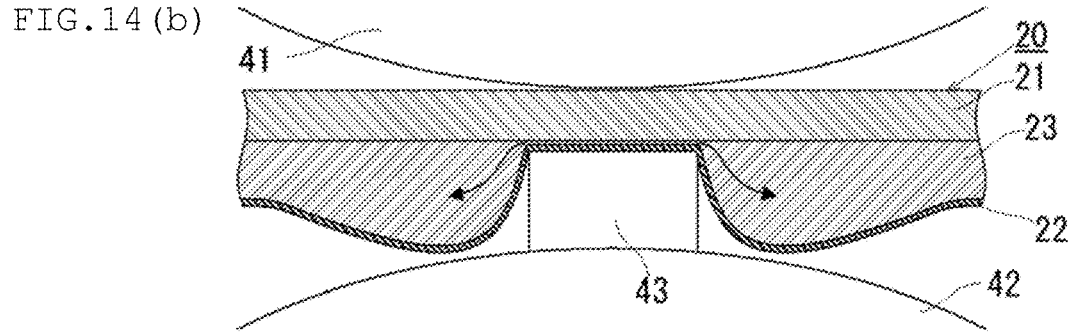
FIG. 14(a) is a side cross-sectional view and FIG. 14(b) is an enlarged side cross-sectional view, for explaining a processing step according to an affixing method of a fourth invention.

In the present affixing method, the processing step S11 can be performed using a processing device 40 (see FIGS. 14(a) and (b)) capable of executing the processing step S11.

In the processing step S11, the protective film 20 is processed so that the sites different in thicknesses are formed by causing offset of the thick portion in the layer (unevenness absorption layer 23) exhibiting fluidity or plasticity, so that the processed film 20A is formed.

In the present affixing method, the arrangement step S12 and the affixing step S13 can be performed using the affixing apparatus 30 (see FIGS. 15 and 16) capable of executing these steps.

In the arrangement step S12, the processed film 20A is arranged on the main surface 10A such that the region 201 having a relatively large thickness, among the sites different in thicknesses, is positioned on the blank region surface 101A.

In the affixing step S13, the processed film 20A is pressed against the main surface 10A by the pressing member 32, and the thick portion (unevenness absorption layer 23) is thickly offset on the region 201 having a relatively large thickness arranged on the blank region surface 101A of the main surface 10A, so that the step of the main surface 10A is filled, and the surface of the protective film 20 (processed film 20A) becomes flat.

The affixing apparatus 30 used in the arrangement step S12 and the affixing step S13 of the present affixing method can be one having a chuck table 31, a pressing member 32, a support member 33, and the like substantially similar to those of the affixing apparatus 30 used in the affixing methods of the first and second embodiments described above. The details of the affixing apparatus 30 are as described in the above section "[4] Affixing apparatus", and thus the description thereof is omitted.

[9] Processing Device

The processing device 40 is not particularly limited as long as it has a configuration capable of executing the processing step S11.

As the processing device 40, the following configuration can be exemplified.

As illustrated in FIGS. 14(a) and (b), the processing device 40 includes a first roller 41 and a second roller 42 arranged to face each other across the protective film 20.

The first roller 41 is rotatably supported above the protective film 20 so as to be in contact with the base layer 21 of the protective film 20.

The second roller 42 is rotatably supported below the protective film 20 so as to be in contact with the adhesive layer 22 of the protective film 20.

On a peripheral surface of the second roller 42, a plurality of protrusions 43 are provided to protrude.

Materials, driving methods, configurations, and the like of the first roller 41, the second roller 42, and the protrusions 43 are not particularly limited as long as the protective film 20 can be processed.

[10] Processing Step

In the processing step S11, as illustrated in FIG. 14(a), the protective film 20 is supplied between the first roller 41 and the second roller 42 of the processing device 40, and the protective film 20 is sent out from between the first roller 41 and the second roller 42 in a traveling direction indicated by an arrow in FIG. 14(a).

In the processing step S11, the protective film 20 sent from between the first roller 41 and the second roller 42 is processed into the processed film 20A in which the sites different in thicknesses are formed.

The shape of the protective film 20 to be supplied to the processing device 40 is not particularly limited, and any of a circular shape, a square shape, a rectangular shape, and a band shape in plan view can be used.

A method for supplying the protective film 20 is not particularly limited, and either a batch method in which the protective film 20 is supplied one by one or a continuous method in which the protective film 20 is continuously supplied can be used.

In the processing step S11 illustrated in FIGS. 14(a) and (b), the shape of the protective film 20 to be supplied is circular in plan view according to the main surface 10A, and the method for supplying the protective film 20 is a batch method.

In the processing device 40, the protective film 20 rotates each of the first roller 41 and the second roller 42 when being sandwiched between the first roller 41 and the second roller 42 and sent out in the traveling direction.

The second roller 42 has a protrusion 43 formed on a peripheral surface thereof, and, as illustrated in FIG. 14(b), the protrusion 43 is brought into contact with the protective film 20 as the second roller 42 rotates.

The site of the protective film 20 in contact with the protrusion 43 is crushed in the thickness direction between this protrusion 43 and the first roller 41.

As illustrated by an arrow in FIG. 14(b), the thick portion (unevenness absorption layer 23) at the crushed site of the protective film 20 flows to the site adjacent to the crushed site and is offset, so that the amount of thickness at the adjacent site is increased.

In the protective film 20, the sites different in thicknesses are formed such that the crushed site is thin and the site adjacent to the crushed site is thick, and the processed film 20A is prepared.

The processed film 20A has the region 201 having a relatively large thickness among the sites different in thicknesses, and, in the arrangement step S12, the region 201 having a relatively large thickness is used.

[11] Arrangement Step

Figure 15:
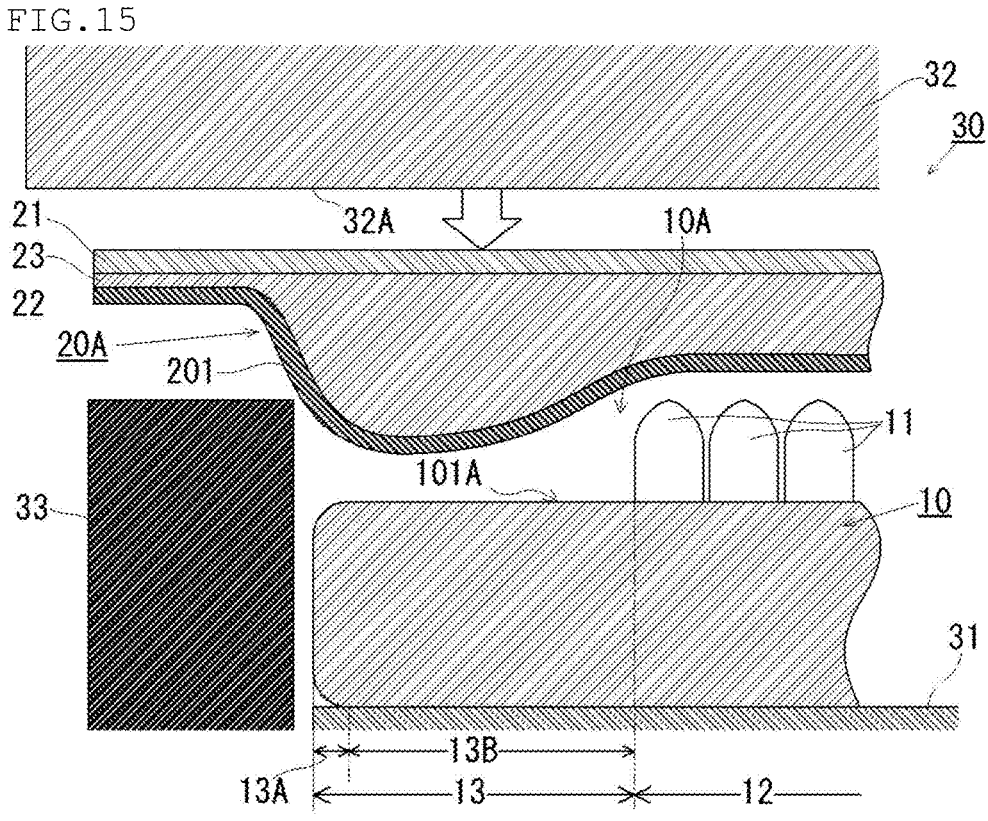
FIG. 15 is an enlarged side cross-sectional view for explaining an arrangement step according to the affixing method of the fourth invention.

As illustrated in FIG. 15, the arrangement step S12 is a step of supplying the processed film 20A prepared in the processing step S11 onto the main surface 10A of the semiconductor wafer 10 in a state where the pressing member 32 is separated from the semiconductor wafer 10 fixed to the chuck table 31.

In this arrangement step S12, the supplied processed film 20A is arranged so as to cover the main surface 10A of the semiconductor wafer 10.

In addition, beside the semiconductor wafer 10, the support member 33 is installed along the outer peripheral edge of the second region 13.

At this time, in the processed film 20A, the region 201 having a relatively large thickness is made to correspond to the second region 13, so that the region 201 having a relatively large thickness is arranged to be positioned above the blank region surface 101A.

[12] Affixing Step

Figure 16:
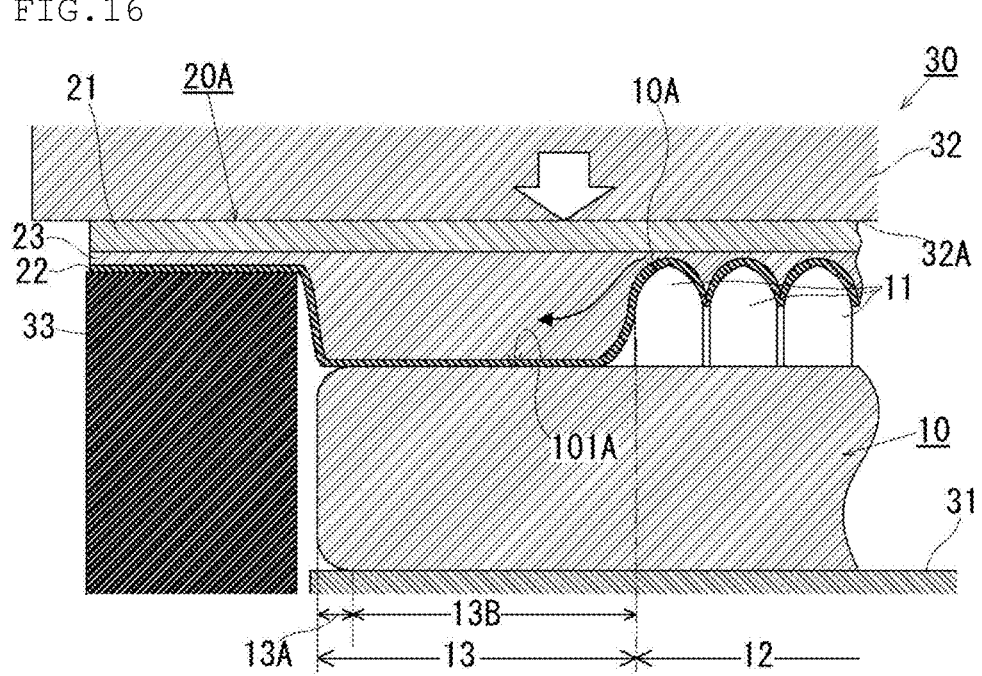
FIG. 16 is an enlarged side cross-sectional view for explaining an affixing step according to the affixing method of the fourth invention.

In the affixing step S13, as illustrated in FIG. 16, the edge part of the protective film 20 is supported by the support member 33, the pressing member 32 is brought close to the main surface 10A of the semiconductor wafer 10, and the protective film 20 is pressed against the main surface 10A by the pressing member 32.

In the affixing step S13, on the first region 12 of the main surface 10A, the thick portion (unevenness absorption layer 23) of the processed film 20A sandwiched between the pressing member 32 and the bumps 11 and crushed in the thickness direction is deformed following the unevenness of the bumps 11 to fill the unevenness.

In the compression step S3, the edge part of the protective film 20 is sandwiched between the support member 33 and the pressing member 32, so that the flow of the thick portion from the blank region surface 101A to the edge part of the protective film 20 is restricted, and the thick portion is prevented from being escaped further outward from the peripheral edge of the second region 13.

As indicated by an arrow in FIG. 16, a part of the thick portion of the processed film 20A crushed in the thickness direction then flows onto the blank region 13B of the second region 13, and the amount of thickness of the processed film 20A on the blank region surface 101A is increased.

In the processed film 20A, the region 201 having a relatively large thickness is arranged on the blank region surface 101A in the arrangement step S12 (see FIG. 15), and thus the part of the thick portion having flowed from the first region 12 is added in the affixing step S13, so that the amount of thickness of the processed film 20A on the blank region surface 101A is further increased (see FIG. 16).

In the processed film 20A, the site adjacent to the region 201 having a relatively large thickness is crushed and thinned in the processing step S11 described above, and thus it is possible to suppress the escape of the thick portion further outward from the peripheral edge of the second region 13 via the crushed and thinned site.

Furthermore, in the affixing step S13, by sandwiching the site crushed and thinned in the processing step S11 between the support member 33 and the pressing member 32, it is possible to prevent the thick portion from being escaped further outward from the peripheral edge of the second region 13.

Therefore, in the processed film 20A, the region 201 having a relatively large thickness is made to correspond to the second region 13, and the thick portion flows in from the first region 12, leading to replenishment with a sufficient amount of thickness to fill the step over the entire second region 13.

As described above, in the processed film 20A on the blank region surface 101A replenished with the amount of thickness, the step over the entire second region 13 is filled by increasing the thickness.

In addition, since the surface of the processed film 20A is pressed by the pressing member 32, the surface becomes flat following the pressing surface 32A without being affected by the flow of the thick portion.

In the above description, explanation has been made, taking the blank region 13B as an example of the second region 13. However, similarly as in the blank region 13B, the thick portion of the processed film 20A is thickly offset on the second region 13 to fill the step, in the peripheral edge region 13A.

Further, the blank region 13B is not limited to the one mainly used as the identification region as illustrated in FIGS. 1(a) and (b), and the same effects can be obtained also by the blank region 13B as illustrated in FIGS. 11(a) and (b).

That is, the present affixing method is particularly useful in a case where the target semiconductor wafer 10 includes the blank region 13B having the flat blank region surface 101A in the second region 13 which is a region where no bumps are arranged.

The surface of the protective film 20 affixed to the semiconductor wafer 10 becomes a uniform flat surface as a whole without forming a defect following the step of the semiconductor wafer 10.

[13] Processing Step (Fourth Embodiment)

The affixing method including the present processing step is a fourth embodiment according to the fourth invention. This affixing method (fourth embodiment) is the same as that of the above-described third embodiment except for the processing device 40 and the processing step S11 using the processing device 40, and the detailed description of the components and steps other than the processing device 40 and the processing step S11 will be omitted.

The affixing method (fourth embodiment) including the present processing step is included in the method for manufacturing a semiconductor component according to the fifth invention, similarly to the third embodiment.

In addition, the semiconductor wafer 10 and the protective film 20 to be subjected to the affixing method (fourth embodiment) including the present processing step are the same as those to be subjected to the affixing method of each of the above-described embodiments including the third embodiment, and the description thereof will be omitted.

Figures 17A, 17B:
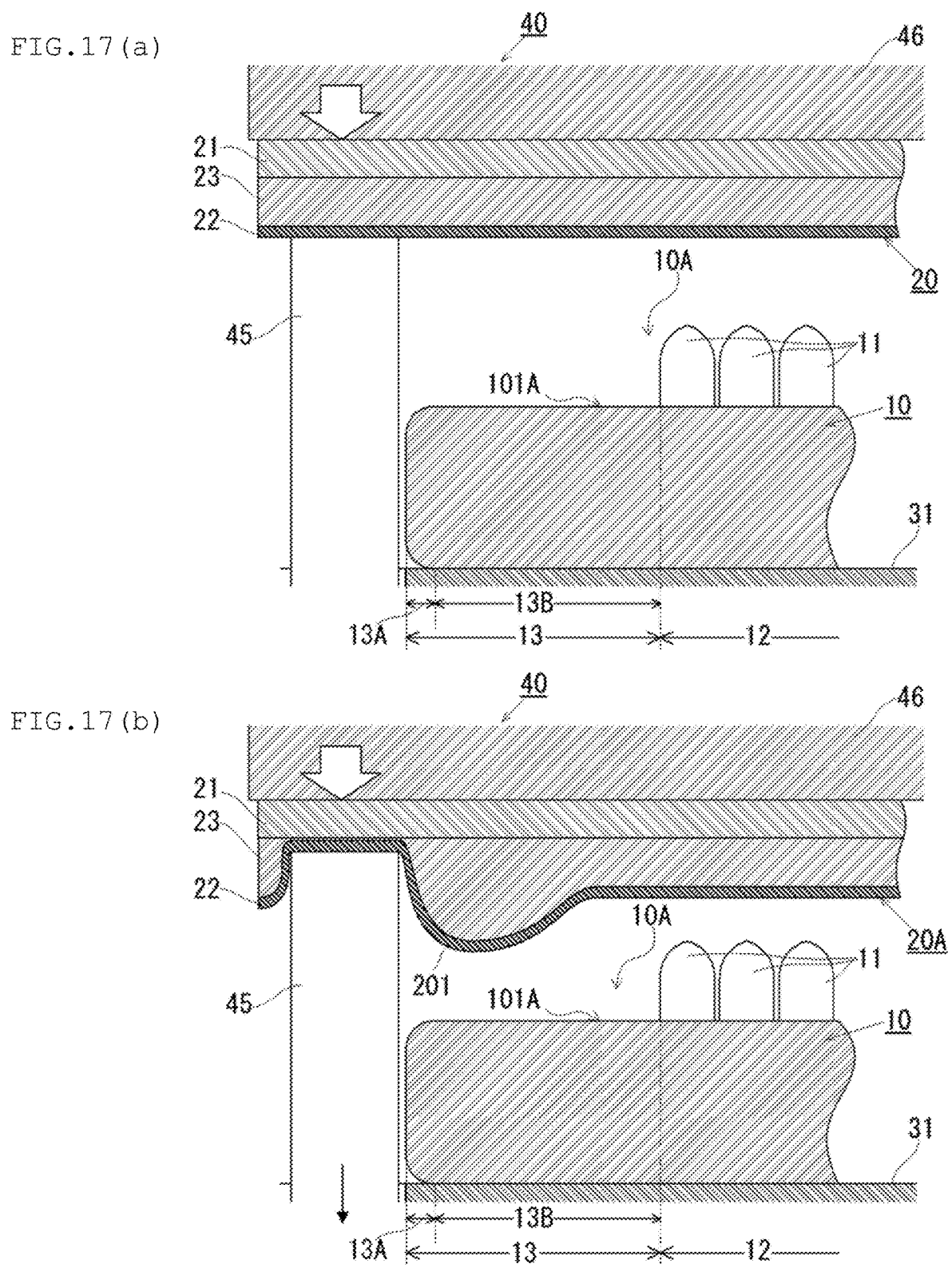
FIGS. 17(a) and (b) are enlarged side cross-sectional views for explaining another example of the processing step according to the affixing method of the fourth invention.

In the present processing step S11, as illustrated in FIGS. 17(a) and (b), the processing device 40 includes a support column 45 erected beside the semiconductor wafer 10 along the outer peripheral edge of the second region 13 of the semiconductor wafer 10 supported and fixed on the chuck table 31, and a pressing body 46 arranged to face the support column 45 in a vertical direction with the protective film 20 interposed therebetween.

The support column 45 supports the edge part of the protective film 20 so that the protective film 20 is arranged at a position above the semiconductor wafer 10, and is configured to lower to bring the protective film 20 close to the main surface 10A of the semiconductor wafer 10.

The pressing body 46 is formed in a plate shape, and is configured to low and approach the support column 45.

The protective film 20 supported by the support column 45 is sandwiched between the support column 45 and the pressing body 46 when the pressing body 46 lowers, and thus crushed and processed.

Materials, driving methods, and the like of the support column 45 and the pressing body 46 described above are not particularly limited as long as the protective film 20 can be processed.

The processing step S11 using the above-described processing device 40 will be described.

As illustrated in FIG. 17(*a*), in the processing step S11, the protective film 20 is crushed in the thickness direction between the support column 45 and the pressing body 46.

As illustrated in FIG. 17(*b*), the thick portion (unevenness absorption layer 23) at the crushed portion of the protective film 20 flows to the site adjacent to the crushed site and is offset, so that the amount of thickness at the adjacent site is increased.

In the protective film 20, the sites different in thicknesses are formed such that the crushed site is thin and the site adjacent to the crushed site is thick, and the processed film 20A is prepared.

The processed film 20A has the region 201 having a relatively large thickness among the sites different in thicknesses, and the position of the region 201 having a relatively large thickness corresponds to the second region 13 of the semiconductor wafer 10 because the support column 45 is provided along the outer peripheral edge of the second region 13.

Therefore, as indicated by an arrow in FIG. 17(*b*), the processing step S11 can be executed, including the arrangement step S12, by lowering the support column 45 and arranging the region 201 having a relatively large thickness of the processed film 20A above the blank region surface 101A.

EXAMPLES

Hereinafter, the present invention will be described in more detail by way of examples.

[1] Protective Film

As the protective film 20, a film pasted to a 12-inch ring frame was used.

The configuration of the protective film 20, the base layer 21, the adhesive layer 22, and the unevenness absorption layer 23 are as follows.

Base layer 21: material: polyethylene terephthalate film; thickness: 75 μm.

Adhesive layer 22: material: UV curable acrylic adhesive; thickness: 10 μm.

Unevenness absorption layer 23: material: thermoplastic ethylene-α-olefin copolymer (density: 0.861 g/cm$^3$, G'(25): 5.15 MPa, G'(60): 0.14 MPa, melt flow rate (190° C.): 2.9 g/10 min); thickness: 510 μm.

[2] Semiconductor Wafer

As the semiconductor wafer 10 provided with the bumps 11, one having the following specifications was used.

Diameter: 300 mm.

Thickness: 810 μm.

Material: silicon.

Average height of the bumps 11: 200 μm.

Pitch of the bumps 11: 400 μm.

Non-bump region (peripheral edge region 13A): 3 mm from the outer periphery.

Non-bump region (blank region 13B as identification region): length $L_1$ in FIG. 1(*a*): 90 mm; length $L_2$ in FIG. 1(*a*): 7 mm.

[3] Affixing of Protective Film

Example 1

A vacuum laminator apparatus (product number "TPL-0612W" manufactured by Takatori Co., Ltd.) was prepared, the support member 33 (thickness: 1 mm, width $W_1$: 5 mm) formed in an annular shape in plan view was mounted on the mounting member 31, and the pressing surface 32A of the pressing member 32 was made of iron.

After setting the semiconductor wafer 10 inside the support member 33, the protective film 20 was supplied in a batch manner in the arrangement step, and the protective film 20 was arranged so as to cover the main surface 10A of the semiconductor wafer 10.

Thereafter, the heating temperature of the protective film 20 was set to 80° C., the pressing force by the pressing member 32 was set to 0.7 MPa, and each step was performed in the order of the affixing step and the compression step to affix the protective film 20 to the main surface 10A of the semiconductor wafer 10.

Then, in the peripheral edge part of the protective film 20, a surplus portion protruding from the outer peripheral edge of the semiconductor wafer 10 was cut off to obtain a sample of Example 1.

Comparative Example 1

A sample of Comparative Example 1 was obtained by affixing the protective film 20 to the main surface 10A of the semiconductor wafer 10 and cutting off a surplus portion of the peripheral edge part of the protective film 20 in the same manner as in Example 1 except that a roll pasting apparatus (product number "DR-3000 II" manufactured by Nitto Seiki Co., Ltd.) was used and that the support member 33 was not used.

Comparative Example 2

A sample of Comparative Example 2 was obtained by affixing the protective film 20 to the main surface 10A of the semiconductor wafer 10 and cutting off a surplus portion of the peripheral edge part of the protective film 20 in the same manner as in Example 1 except that the pressing surface 32A was made of silicone rubber and that the support member 33 was not used.

[4] Measurement of Unevenness on Surface of Protective Film

Figure 10:
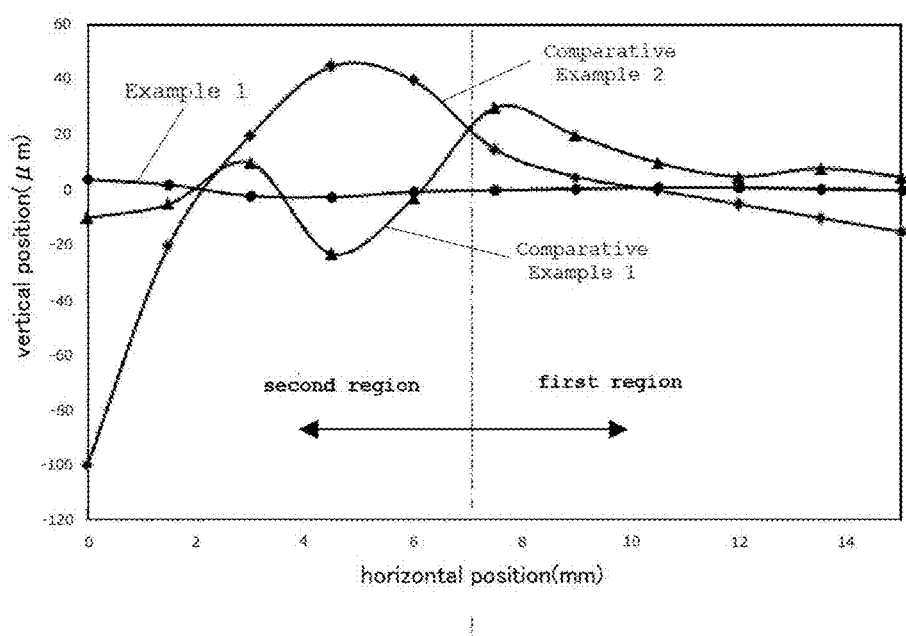
FIG. 10 is a graph for explaining results of measuring unevenness on a surface of a protective film in the Example.
Figure 10:
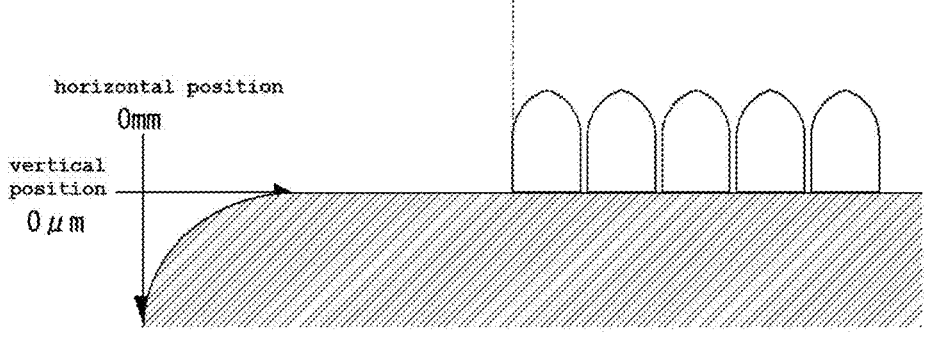

At the end of the peripheral edge of the semiconductor wafer, the vertical position of the surface of the protective film at a predetermined horizontal position was measured with the position shown in the explanatory diagram in the lower part of FIG. 10 as a horizontal position of 0 mm and a vertical position of 0 μm. The results are shown graphically in the upper part of FIG. 10.

Note that, in the explanatory diagram in the lower part of FIG. 10, the horizontal position is drawn to correspond to the upper graph, and the vertical position is drawn to be exaggerated.

As a result of measuring the vertical position of the surface of the protective film, the following facts were found from the graph in FIG. 10.

In Example 1, there was almost no height difference in the vertical position at any horizontal position, and the surface of the protective film was flat.

In Comparative Example 1, the vertical position is low around a horizontal position of 4 mm, that is, in the second region, and the vertical position is high in the range where the horizontal position is 7 to 8 mm, that is, in the first region. From this result, it was found that, in Comparative Example 1, a dent was formed on the surface of the protective film in the second region so as to correspond to the step generated between the second region and the first region.

In Comparative Example 2, the vertical position tends to increase in the range where the horizontal position is 5 mm or less, that is, in the second region, while the vertical position tends to decrease in the range where the horizontal position is 7 mm or more, that is, in the first region. From this result, it was found that, in Comparative Example 2, the protective film was bent in a mountain shape in the second region due to the influence of the step generated between the second region and the first region, and that a dent was formed on the surface of the protective film in the first region.

INDUSTRIAL APPLICABILITY

The method for affixing a protective film of the present invention is widely used in applications of manufacturing semiconductor components. In particular, in a semiconductor wafer to be subjected to a back grinding step, the method has a characteristic of capable of suitably flattening a protective film surface, and thus is suitably used for manufacturing a component excellent in productivity.

REFERENCE SIGNS LIST

10 Semiconductor wafer
10A Main surface
11 Bump
12 First region
13 Second region
13A Peripheral edge region
13B Blank region
14 Chamfered portion
20 Protective film
20A Processed film
21 Base layer
22 Adhesive layer
23 Unevenness absorption layer
30 Affixing apparatus
31 Chuck table
32 Pressing member
32A Pressing surface
33 Support member
33A Support surface
40 Processing device 41 First roller
42 Second roller
43 Protrusion
45 Support column
46 Pressing body

The invention claimed is:

1. A method for affixing a protective film, comprising:
an arrangement step of arranging a protective film so as to cover a main surface of a semiconductor wafer; and
an affixing step of pressing the protective film against the main surface to affix the protective film to the main surface, characterized in,
that the main surface has a first region in which bumps are arranged and a second region which includes at least a part of a peripheral edge of the main surface and in which no bumps are arranged,
that the affixing step includes a compression step of compressing the protective film in a thickness direction thereof, and
that the compression step is performed using a pressing member for pressing the protective film against the main surface and a support member installed along an outer peripheral edge of the second region,
wherein the arrangement step is a step of arranging the protective film such that an edge part of the protective film is positioned on an inner peripheral side of the support member, and
wherein the compression step is a step of compressing the edge part of the protective film with the pressing member, an inner peripheral surface of the support member, and the main surface so that the inner peripheral surface of the support member blocks bulging of the protective film in an outer peripheral direction of the second region when the protective film is sandwiched between the pressing member and the main surface.

2. The method for affixing a protective film according to claim 1, wherein the pressing member has a pressing surface on its entire lower surface, the pressing surface is a flat surface.

3. The method for affixing a protective film according to claim 1, wherein the protective film has a layer capable of exhibiting fluidity or plasticity.

4. The method for affixing a protective film according to claim 3, wherein the compression step is performed in a state where the protective film is heated and the fluidity or the plasticity is exhibited.

5. The method for affixing a protective film according to claim 1, having a relationship of $0.5 \leq H2/H1$, where an average height of the bumps is H1 and an average thickness of the protective film is H2.

* * * * *